(12) United States Patent
Inoue et al.

(10) Patent No.: US 9,559,661 B2
(45) Date of Patent: Jan. 31, 2017

(54) DUPLEXER, FILTER AND COMMUNICATION MODULE

(71) Applicant: TAIYO YUDEN CO., LTD., Tokyo (JP)

(72) Inventors: Shogo Inoue, Tokyo (JP); Masafumi Iwaki, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/941,324

(22) Filed: Nov. 13, 2015

(65) Prior Publication Data

US 2016/0072477 A1    Mar. 10, 2016

Related U.S. Application Data

(63) Continuation of application No. 13/604,526, filed on Sep. 5, 2012, now Pat. No. 9,219,467.

(30) Foreign Application Priority Data

Nov. 4, 2011    (JP) ................................. 2011-242645
Jul. 17, 2012    (JP) ................................. 2012-158654

(51) Int. Cl.
*H03H 9/70*    (2006.01)
*H03H 9/54*    (2006.01)
(Continued)

(52) U.S. Cl.
CPC ............. *H03H 9/54* (2013.01); *H03H 9/6433* (2013.01); *H03H 9/70* (2013.01); *H03H 9/706* (2013.01); *H03H 9/725* (2013.01)

(58) Field of Classification Search
CPC .......... H03H 9/54; H03H 9/6433; H03H 9/70; H03H 9/706; H03H 9/725
(Continued)

(56) References Cited

U.S. PATENT DOCUMENTS 3,943,389 A    3/1976    Hickernell et al.
4,599,587 A    7/1986    Hartmann et al.
(Continued)

FOREIGN PATENT DOCUMENTS

EP    2 381 576 A1    10/2011
JP    62-261211 A    11/1987
(Continued)

OTHER PUBLICATIONS

Japanese Office Action dated Mar. 22, 2016 in a counterpart Japanese patent application No. 2012-158654.
(Continued)

*Primary Examiner* — Stephen E Jones
*Assistant Examiner* — Scott S Outten
(74) *Attorney, Agent, or Firm* — Chen Yoshimura LLP

(57) ABSTRACT

A duplexer includes: a transmit filter that is connected between an antenna terminal and a transmit terminal and has a plurality of acoustic wave resonators; a receive filter that is connected between the antenna terminal and a receive terminal and has a plurality of acoustic wave resonators; and a delay line or a longitudinal coupling type resonator that is connected in parallel with at least one of the plurality of acoustic wave resonators of the transmit filter and the plurality of acoustic wave resonators of the receive filter and has at least two IDTs (Interdigital Transducers).

19 Claims, 36 Drawing Sheets

(51) Int. Cl.
*H03H 9/64* (2006.01)
*H03H 9/72* (2006.01)

(58) Field of Classification Search
USPC .......................................................... 333/133
See application file for complete search history.

(56) References Cited

U.S. PATENT DOCUMENTS

| | | | |
|---|---|---|---|
| 6,380,827 | B1 | 4/2002 | Noguchi |
| 2003/0214368 | A1 | 11/2003 | Taniguchi |
| 2004/0155730 | A1 | 8/2004 | Iwamoto et al. |
| 2010/0026419 | A1 | 2/2010 | Hara et al. |
| 2010/0150075 | A1 | 6/2010 | Inoue et al. |
| 2010/0194494 | A1 | 8/2010 | Inoue et al. |
| 2011/0193650 | A1* | 8/2011 | Takenoshita ......... H03H 9/0576 333/4 |
| 2011/0254639 | A1 | 10/2011 | Tsutsumi et al. |
| 2012/0293276 | A1 | 11/2012 | Iwaki et al. |

FOREIGN PATENT DOCUMENTS

| | | |
|---|---|---|
| JP | 2003-332885 A | 11/2003 |
| JP | 2004-242280 A | 8/2004 |
| JP | 2005-136658 A | 5/2005 |
| JP | 2010-178186 A | 8/2010 |
| JP | 2011-71911 A | 4/2011 |
| WO | 2009/025106 A1 | 2/2009 |
| WO | 2011/092959 A1 | 8/2011 |

OTHER PUBLICATIONS

European Search Report dated Feb. 25, 2014, in a counterpart European patent application No. 12182968.3.

Waki et al., "An Attenuation Improvement Technology for Ladder SAW/FBAR Filters and Duplexers Employing Cancellation Circuit", The 41st European Microwave Conference (EUMC), 2011, IEEE, Oct. 10, 2011, pp. 751-754, XP032072782, ISBN: 978-1-61284-235-6.

Kuypers J H et al., "Monolithic Phase Shifter Based on Mechanically Tunable Saw Delay Line", Solid-State Sensors, Actuators and Microsystems Conference, 2007. Transducers 2007. International, IEEE, Piscataway, NJ, USA, Jun. 10, 2007, pp. 161-164, XP031215996, ISBN: 978-1-4244-0841-2.

Urabe, "Voltage Controlled Monolithic SAW Phase Shifter and Its Application to Frequency Variable Oscillator", IEEE Transactions on Sonics and Ultrasonics, IEEE, vol. SU-29, No. 5, Sep. 1, 1982, pp. 255-260, XP014404449, ISSN: 0018-9537, DOI: 10.1109/T-SU.1982.31347.

* cited by examiner

DUPLEXER, FILTER AND COMMUNICATION MODULE

CROSS-REFERENCE TO RELATED APPLICATION

This application is a continuation application of a pending application, U.S. application Ser. No. 13/604,526 filed on Sep. 5, 2012, which is hereby incorporated by reference in its entirety. The parent application is based upon and claims the benefit of priority of the prior Japanese Patent Application No. 2011-242645, filed on Nov. 4, 2011, the entire contents of which are incorporated herein by reference. Further, the application is based upon the prior Japanese Patent Application No. 2012-158654 filed on Jul. 17, 2012, the entire contents thereof are incorporated herein by reference.

FIELD

A certain aspect of the present invention relates to a duplexer, a filter and a communication module.

BACKGROUND

Recently, a multi-band and a multi-system of a wireless communication device such as a mobile phone unit is developed. A single wireless communication device has a plurality of wireless communication devices. On the other hand, downsizing of the wireless communication device is continuously required. Therefore, reducing of the number of components used in a wireless communication device is examined. For example, reducing of the number of components by removing an interstage filter of a transmit line or a receive line is examined. However, in this case, improvement of attenuation characteristic of a filter or improvement of isolation characteristic between a transmit terminal and a receive terminal of a duplexer is required.

There is supposed a method of connecting an inductor in series with a parallel resonator in a case where a ladder type acoustic wave filter is used, as a method of improving the attenuation characteristic of a filter or the isolation characteristic of a duplexer. However, with the method, there is a problem that insertion loss may be increased. Japanese Patent Application Publication No. 2011-71911 (hereinafter referred to as Document 1) discloses a filter achieving high attenuation, high isolation and low loss. In the filter of Document 1, a phase converter is connected in parallel with a resonator connected to a filter portion extracting a signal having an arbitrary frequency band. The filter converts a phase of a signal input into the phase converter into another phase that is different from a phase at the resonator by 180 degrees. Japanese Patent Application Publications No. 2004-242280 and No. 2005-136658 and International Publication No. WO2009/025106 Pamphlet disclose a technology in which a part of a transmit signal is extracted into a line having a capacitor, another part of the transmit signal leaking to a receive side is canceled by the signal passing through the line, and isolation characteristic is improved.

However, it is difficult for the filter of Document 1 to achieve the attenuation characteristic, the improvement of the isolation characteristic and the low loss together with each other, because it is not easy for a phase converter to convert a phase into another phase that is different from a phase at the resonator by 180 degrees.

SUMMARY OF THE INVENTION

According to an aspect of the present invention, there is provided a duplexer including: a transmit filter that is connected between an antenna terminal and a first terminal and that includes a first group of acoustic wave resonators that are located in a first path connected between the antenna terminal and the first terminal; a receive filter that is connected between the antenna terminal and a second terminal and that includes a second group of acoustic wave resonators that are located in a second path connected between the antenna terminal and the second terminal and; a cancel circuit, the cancel circuit including: a third path having a first node and a second node, each of which is located in the first path or the second path so that the third path is parallelly connected to at least a part of the first and second group of acoustic wave resonators; a pair of first capacitors that are located in the third path and that are connected in series between the first and second nodes and; a first acoustic wave resonator that is located in the third path and that is connected between the pair of first capacitors.

According to another aspect of the present invention, there is provided a duplexer including: a transmit filter that is connected between an antenna terminal and a first terminal and that includes a first group of acoustic wave resonators that are located in a first path connected between the antenna terminal and the first terminal; a receive filter that is connected between the antenna terminal and a second terminal and that includes a second group of acoustic wave resonators that are located in a second path connected between the antenna terminal and the second terminal and; a cancel circuit, the cancel circuit including: a third path having a first node and a second node, each of which is located in the first path or the second path so that the third path is parallelly connected to at least a part of the first and second group of acoustic wave resonators; a first capacitor that is located in the third path and that is connected in series between the first and second nodes; a first acoustic wave resonator that is located in the third path and that is connected to the first capacitor in series; and a second acoustic wave resonator having two end, one end being connected to a third node between the first and second nodes in the third path and another end being connected to ground.

According to another aspect of the present invention, there is provided a duplexer including: a transmit filter that is connected between an antenna terminal and a first terminal and that includes a first group of acoustic wave resonators that are located in a first path connected between the antenna terminal and the first terminal; a receive filter that is connected between the antenna terminal and a second terminal and that includes a second group of acoustic wave resonators that are located in a second path connected between the antenna terminal and the second terminal and; a cancel circuit, the cancel circuit including: a third path having a first node and a second node, each of which is located in the first path or the second path so that the third path is parallelly connected to at least a part of the first and second group of acoustic wave resonators; a pair of first capacitors that are located in the third path and that are connected in series between the first and second nodes and; a first acoustic wave resonator or an acoustic wave delay line that is located in the third path and that is connected between the pair of first capacitors.

DETAILED DESCRIPTION

Figure 1:
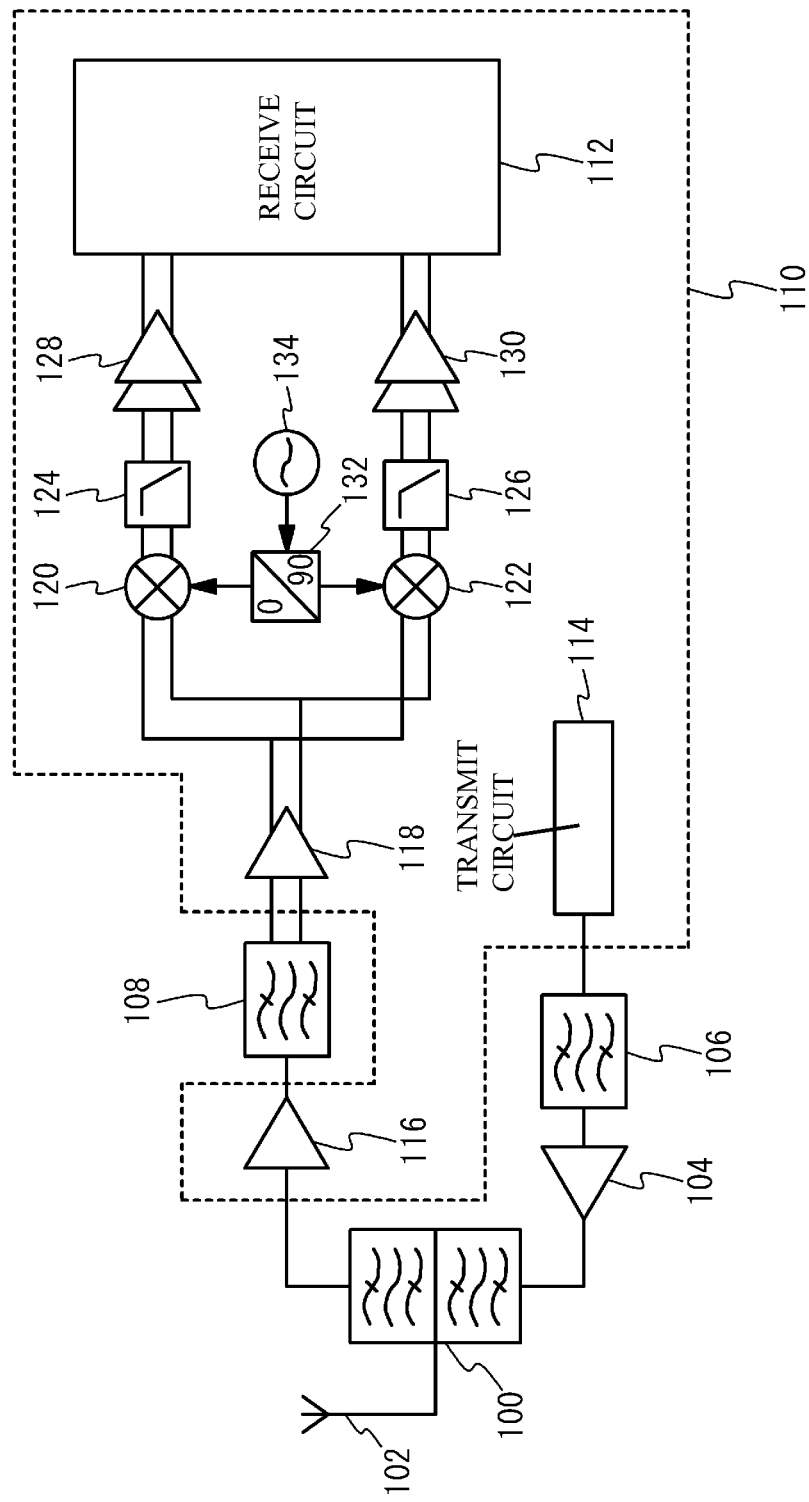
FIG. 1 illustrates a block diagram of a mobile phone terminal.

First, a description will be given of a reason that improvement of isolation characteristics of a duplexer is demanded. FIG. 1 illustrates a RF (Radio Frequency) block diagram of a mobile phone terminal. As illustrated in FIG. 1, the mobile phone terminal has a duplexer 100, an antenna 102, a power amplifier 104, an interstage filters 106 and 108 and a transceiver IC 110. The transceiver IC 110 has a receive circuit 112, a transmit circuit 114, a low noise amplifiers 116 and 118, a mixers 120 and 122, a low pass filters 124 and 126, a variable gain amplifiers 128 and 130, a hybrid 132 and an oscillator 134. The transmit circuit 114 generates a transmit signal. The interstage filter 106 allows passage of the transmit signal and suppresses a signal having a frequency that is different from that of the transmit signal. The power amplifier 104 amplifies the transmit signal. The duplexer 100 outputs the transmit signal to the antenna 102 and does not output the transmit signal to a receive side. The antenna 102 transmits the transmit signal.

The antenna 102 receives a receive signal. The duplexer 100 outputs the receive signal to the receive side, and does not output the receive signal to a transmit side. The low noise amplifiers 116 and 118 amplify the receive signal. The interstage filter 108 allows passage of the receive signal and suppresses a signal having a frequency that is different from that of the receive signal. The interstage filter 108 balanced-outputs an unbalanced input. The hybrid 132 generates two signals having a phase different from each other by 90 degrees from an oscillation signal output by the oscillator 134, and outputs the two signals to the mixers 120 and 122 respectively. The mixers 120 and 122 mix the receive signal and the oscillation signal. The low pass filters 124 and 126 allow passage of the down-converted receive signal and suppresses a carrier signal. The receive circuit 112 receives a signal and processes the signal.

Figure 2:
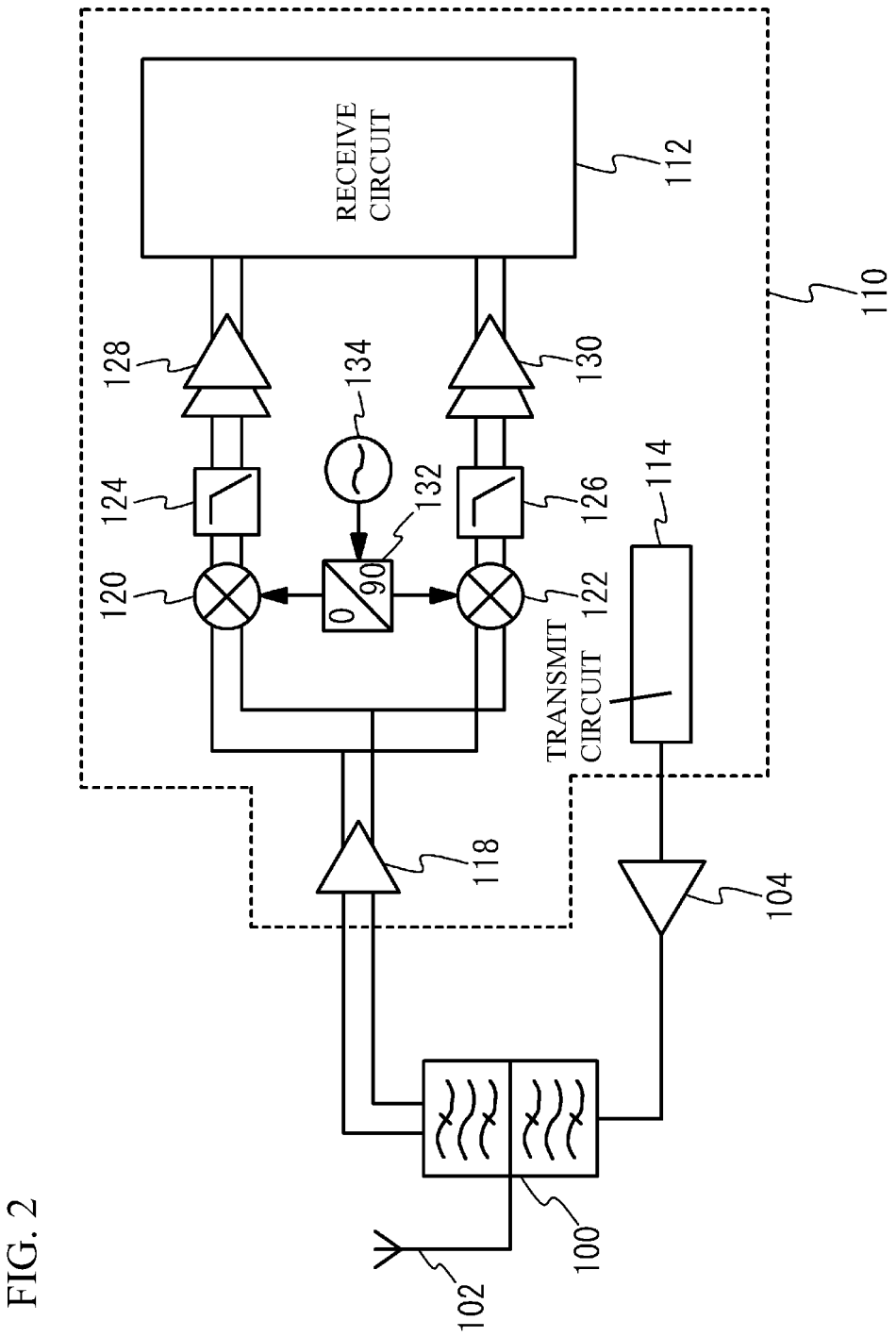
FIG. 2 illustrates a block diagram of a predicted mobile phone terminal.

In order to downsize the mobile phone terminal of FIG. 1, a structure illustrated in FIG. 2 is required. As illustrated in FIG. 2, the interstage filters 106 and 108 and the low noise amplifier 116 are removed, and the duplexer 100 generates a balanced signal. When the interstage filters 106 and 108 are removed, the duplexer 100 also acts as the interstage filters. That is, it is needed that a filter of the duplexer 100 has a suppressing performance of two filters. In concrete, improvement of suppressing degree out of a pass band of a filter characteristic and improvement of an isolation characteristic of a duplexer are demanded.

Figure 3:
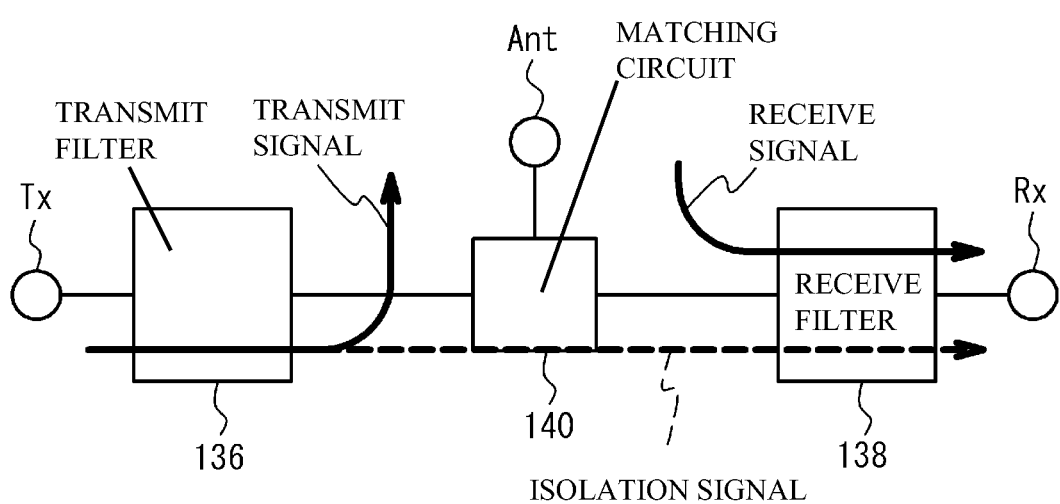
FIG. 3 illustrates a block diagram of a duplexer.

A description will be given of the isolation. FIG. 3 illustrates a block diagram of a duplexer. As illustrated in FIG. 3, the duplexer has a transmit filter 136, a receive filter 138 and a matching circuit 140. The transmit filter 136 is connected between an antenna terminal Ant and a transmit terminal Tx. The receive filter 138 is connected between the antenna terminal Ant and a receive terminal Rx. The matching circuit 140 is connected between the antenna terminal Ant and at least one of the transmit filter 136 and the receive filter 138.

The transmit filter 136 allows passage of a signal of a transmit band of signals input from the transmit terminal Tx to the antenna terminal Ant as the transmit signal, and suppresses other signals having other frequencies. The receive filter 138 allows passage of a signal of a receive band of signals input from the antenna terminal Ant to the receive terminal Rx as the receive signal, and suppresses other signals having other frequencies. The matching circuit 140 is a circuit making an impedance matching so that the transmit signal having passed the transmit filter 136 is output from the antenna terminal Ant without leaking to the receive filter 138 side.

Ideally, it is preferable that all of the transmit signal input from the transmit terminal Tx is output from the antenna terminal Ant via the transmit filter 136 and the matching circuit 140 and is not output to the receive terminal Rx. However, the reality is that all of the transmit signal is not output from the antenna terminal Ant, and a part of the transmit signal is output to the receive terminal Rx via the matching circuit 140 and the receive filter 138. An electrical power of the transmit signal input to the transmit terminal Tx is much larger than that of the receive signal input to the antenna terminal Ant. Therefore, it is required that a rate of the transmit signal output to the receive terminal Rx is greatly reduced. The rate of the electrical power leaked to the receive terminal Rx of the electrical power of the transmit signal input to the transmit terminal Tx is an isolation between the transmit terminal and the receive terminal. The leaked signal is an isolation signal. And so, a description will be given of embodiments achieving improvement of the isolation characteristic.

First Embodiment

Figure 4:
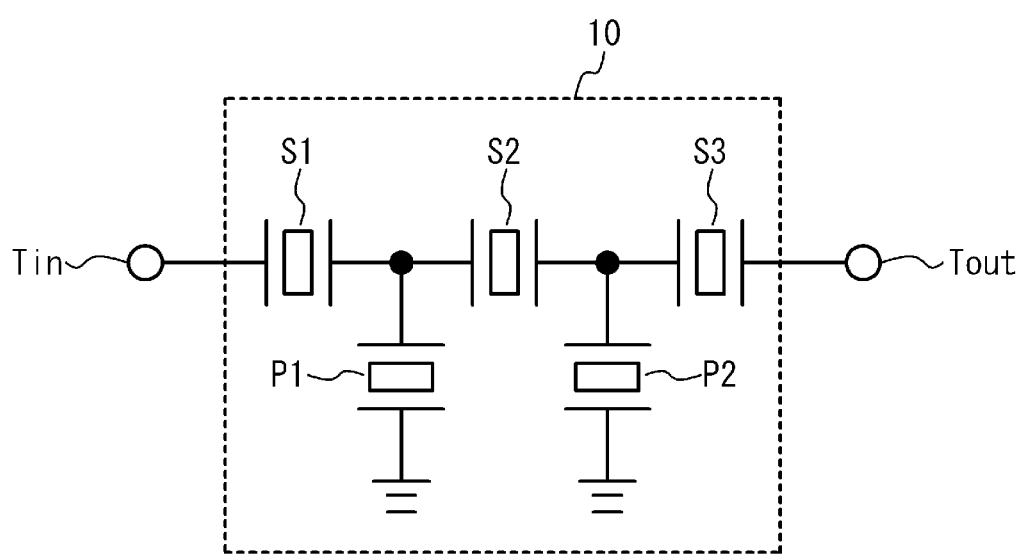
FIG. 4 illustrates an example of a circuit diagram of a ladder type acoustic wave filter.

First, a description will be given of a filter used in a duplexer. FIG. 4 illustrates an example of a circuit diagram of a ladder type acoustic wave filter. As illustrated in FIG. 4, a ladder type acoustic wave filter 10 has series resonators S1 through S3 in which acoustic wave resonators are connected in series and parallel resonators P1 and P2 in which acoustic wave resonators are coupled in parallel, between an input terminal Tin and an output terminal Tout.

Figure 5:
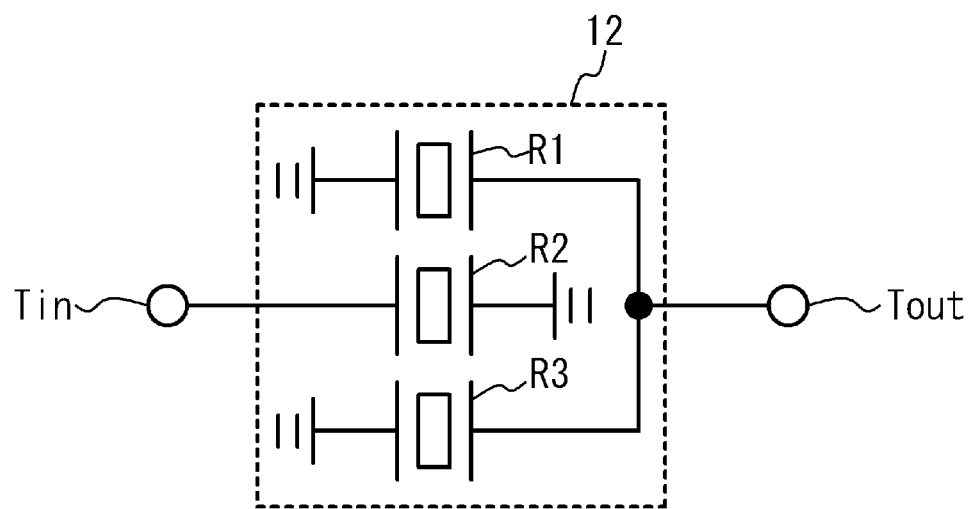
FIG. 5 illustrates an example of a circuit diagram of a longitudinal coupling type acoustic wave resonator filter.

FIG. 5 illustrates an example of a circuit diagram of a longitudinal coupling type acoustic wave resonator filter (a multiple mode filter). As illustrated in FIG. 5, a longitudinal coupling type acoustic wave resonator filter 12 has acoustic wave resonators R1 through R3. The acoustic wave resonators R1 through R3 are arrayed in a propagation direction of an acoustic wave. A first end of the acoustic wave resonator R2 is connected to an input terminal Tin. A second end of the acoustic wave resonator R2 is connected to a ground. First ends of the acoustic wave resonators R1 and R3 are connected to an output terminal Tout. Second ends of the acoustic wave resonators R1 and R3 are connected to the ground.

Figure 6:
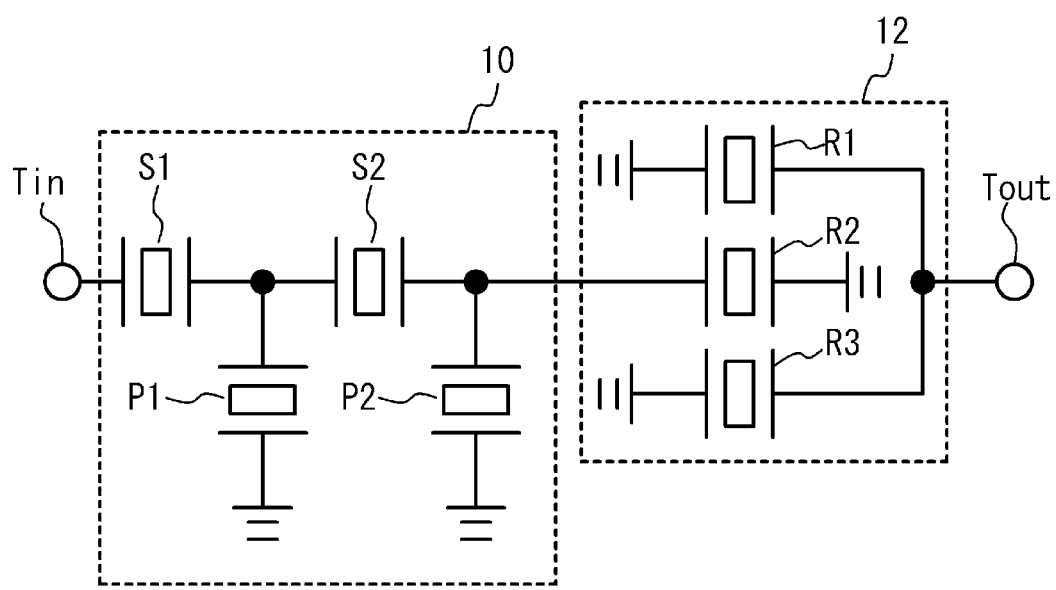
FIG. 6 illustrates an example of a circuit diagram of a filter in which a ladder type acoustic wave filter and a longitudinal coupling acoustic wave resonator filter are combined.

FIG. 6 illustrates an example of a circuit diagram of a filter in which the ladder type acoustic wave filter and the longitudinal coupling type acoustic wave resonator filter are combined. As illustrated in FIG. 6, the ladder type acoustic wave filter 10 and the longitudinal coupling type acoustic wave resonator filter 12 are connected in series between an input terminal Tin and an output terminal Tout. The ladder type acoustic wave filter 10 has the series resonators S1 and S2 and the parallel resonator P1 and P2. The longitudinal coupling type acoustic wave resonator filter 12 has the acoustic wave resonators R1 through R3.

Figure 7:
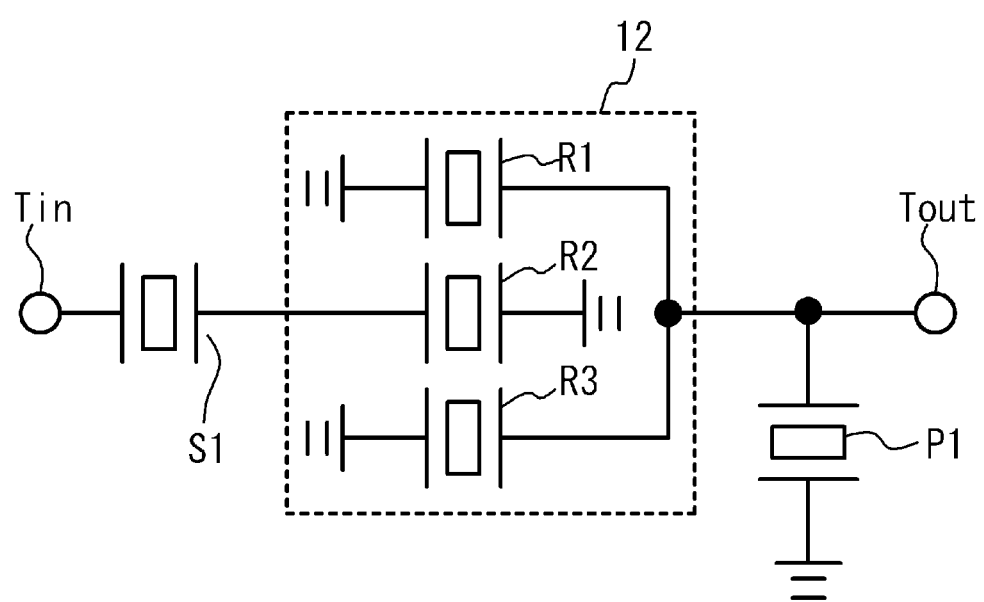
FIG. 7 illustrates an example of a circuit diagram of a filter in which a longitudinal coupling type acoustic wave resonator filter and an acoustic wave resonator are combined.

FIG. 7 illustrates an example of a circuit diagram of a filter in which the longitudinal coupling type acoustic wave resonator filter and an acoustic wave resonator are combined. As illustrated in FIG. 7, the series resonator S1 and the longitudinal coupling type acoustic wave resonator filter 12 are connected in series between an input terminal Tin and an output terminal Tout. The parallel resonator P1 is connected in parallel between the input terminal Tin and the output terminal Tout.

One of the filters illustrated in FIG. 4 through FIG. 7 may be used as a transmit filter and a receive filter of a duplexer.

Figure 8A:
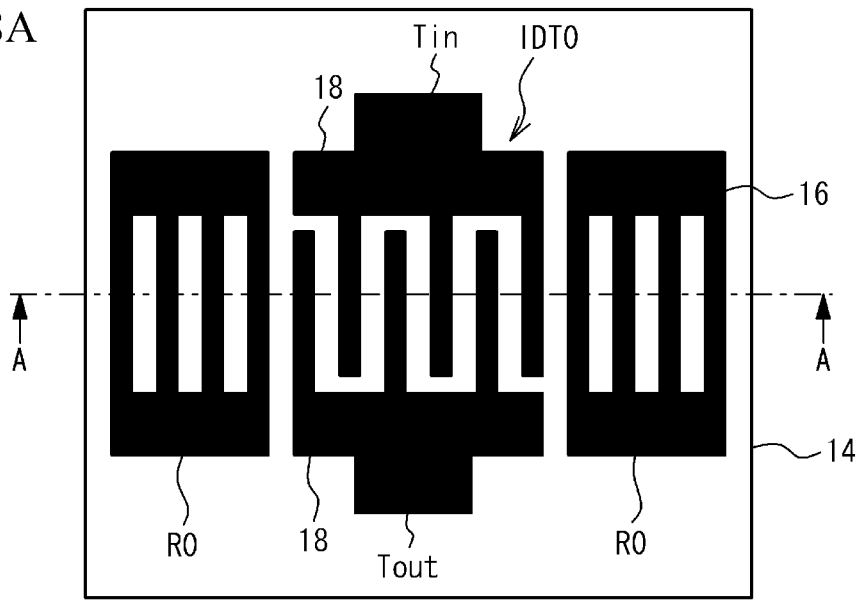
FIG. 8A illustrates an example of a plane view of a surface acoustic wave resonator.
Figure 8B:
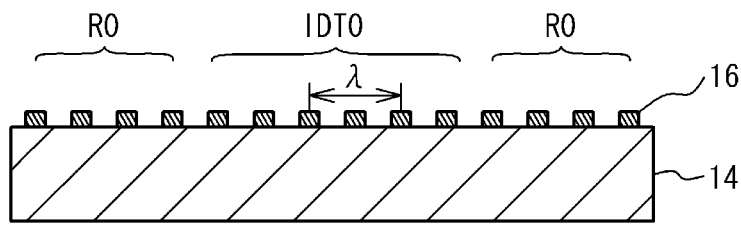
FIG. 8B illustrates an example of a cross sectional view taken along a line A-A of FIG. 8A.
Figure 8C:
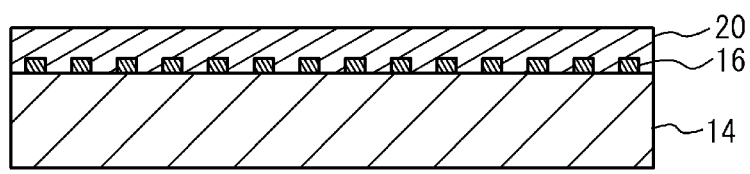
FIG. 8C illustrates an example of a cross sectional view of a love wave resonator.
Figure 8D:
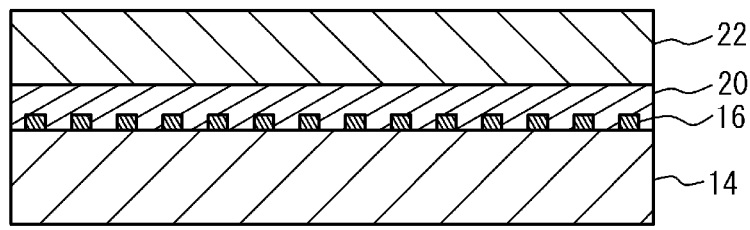
FIG. 8D illustrates an example of a cross sectional view of a boundary acoustic wave resonator.

Next, a description will be given of an example of an acoustic wave resonator used in a filter. FIG. 8A illustrates an example of a plane view of a surface acoustic wave resonator. FIG. 8B illustrates an example of a cross sectional view taken along a line A-A of FIG. 8A. FIG. 8C illustrates an example of a cross sectional view of a love wave resonator. FIG. 8D illustrates an example of a cross sectional view of a boundary acoustic wave resonator. As illustrated in FIG. 8A and FIG. 8B, a metal film 16 such as aluminum or copper is provided on a piezoelectric substrate 14 such as lithium tantalate (LT) or lithium niobate (LN). The metal film 16 forms a reflector R0, an IDT0 (Interdigital Transducer), the input terminal Tin and the output terminal Tout. The IDT has two comb-like electrodes 18. The two comb-like electrodes 18 are connected to the input terminal Tin and the output terminal Tout respectively. The input terminal Tin and the output terminal Tout are a pad or the like. The reflector R0 is provided on both sides of the IDT0 in a propagation direction of an acoustic wave of the IDT0. The comb-like electrode 18 and the reflector R0 have electrode fingers at an interval that is compatible with a wavelength λ of an acoustic wave. An acoustic wave excited by the IDT0 is reflected by the reflector R0. Thus, the surface acoustic wave resonator resonates at a frequency that is compatible with the wavelength λ of the acoustic wave.

Plane views of the love wave resonator and the boundary acoustic wave resonator are the same as FIG. 8A. Therefore, an explanation is omitted. As illustrated in FIG. 8C, in the love wave resonator, a dielectric film 20 is provided so as to cover the metal film 16. A silicon oxide film may be used as the dielectric film 20. As illustrated in FIG. 8D, in the boundary acoustic wave resonator, a dielectric film 22 is further provided on the dielectric film 20. An aluminum oxide film may be used as the dielectric film 22. It is preferable that a sonic speed of the dielectric film 22 is higher than that of the dielectric film 20, in order to confine the acoustic wave in the dielectric film 20.

Figure 9A:
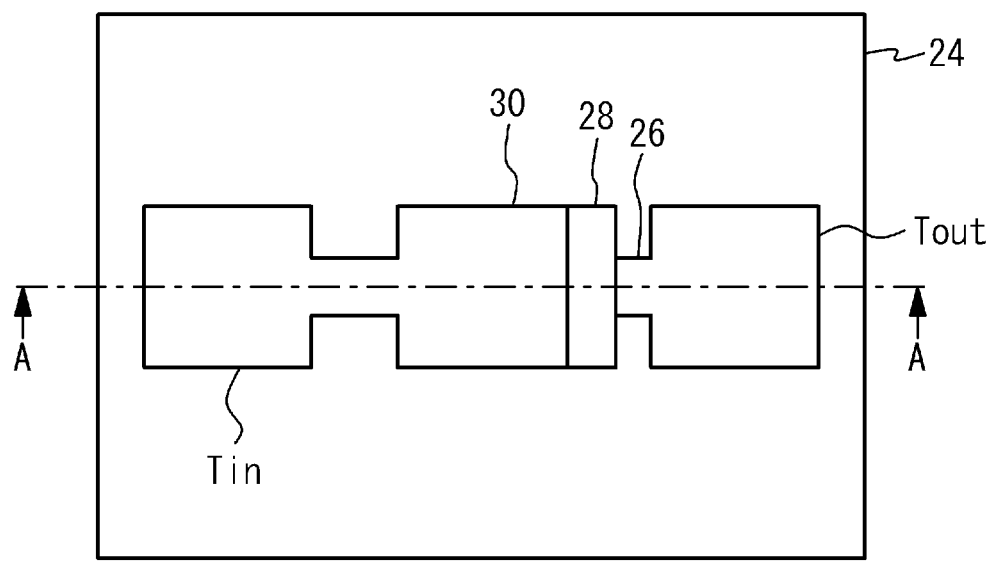
FIG. 9A illustrates an example of a plane view of a piezoelectric thin film resonator.
Figure 9B:
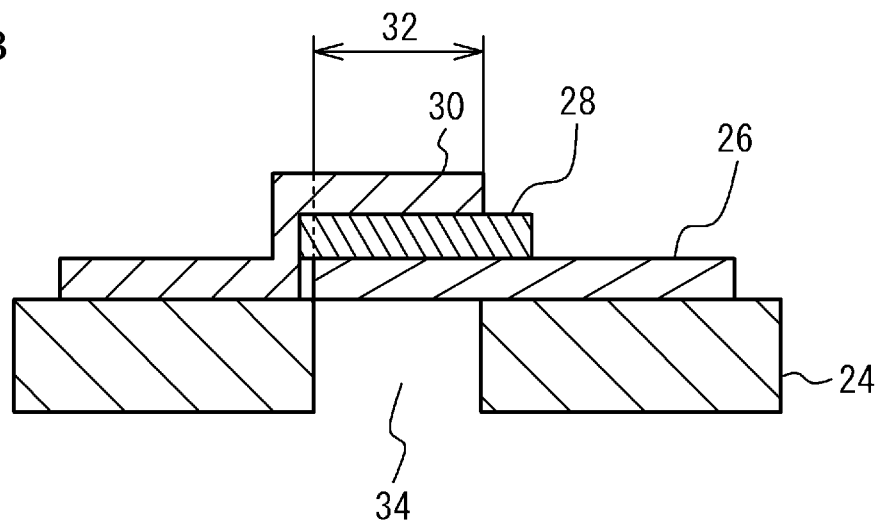
FIG. 9B illustrates an example of a cross sectional view taken along a line A-A of FIG. 9A.

FIG. 9A illustrates an example of a plane view of a piezoelectric thin film resonator. FIG. 9B illustrates an example of a cross sectional view taken along a line A-A of FIG. 9A. As illustrated in FIG. 9A and FIG. 9B, a lower electrode 26, a piezoelectric film 28 such as aluminum nitride and an upper electrode 30 are laminated in this order on a substrate 24 such as silicon. A region in which the upper electrode 30 and the lower electrode 26 sandwich the piezoelectric film 28 and are overlapped with each other is a resonance region 32. In the resonance region 32, an acoustic wave that is excited in the piezoelectric film 28 and propagates vertically (a bulk wave of a thickness extensional vibration) resonates. Therefore, the resonance region 32 acts as a resonator. A cavity 34 is formed in the substrate 24 below the resonance region 32. The cavity 34 may be formed between the substrate 24 and the lower electrode 26. An acoustic multilayer reflecting an acoustic wave may be formed instead of the cavity 34.

At least one of the surface acoustic wave resonator, the love wave resonator, the boundary acoustic wave resonator and the piezoelectric thin film resonator illustrated in FIG. 8A through FIG. 9B may be used as the acoustic wave resonator of the filters illustrated in FIG. 4 through FIG. 7.

Figure 10A:
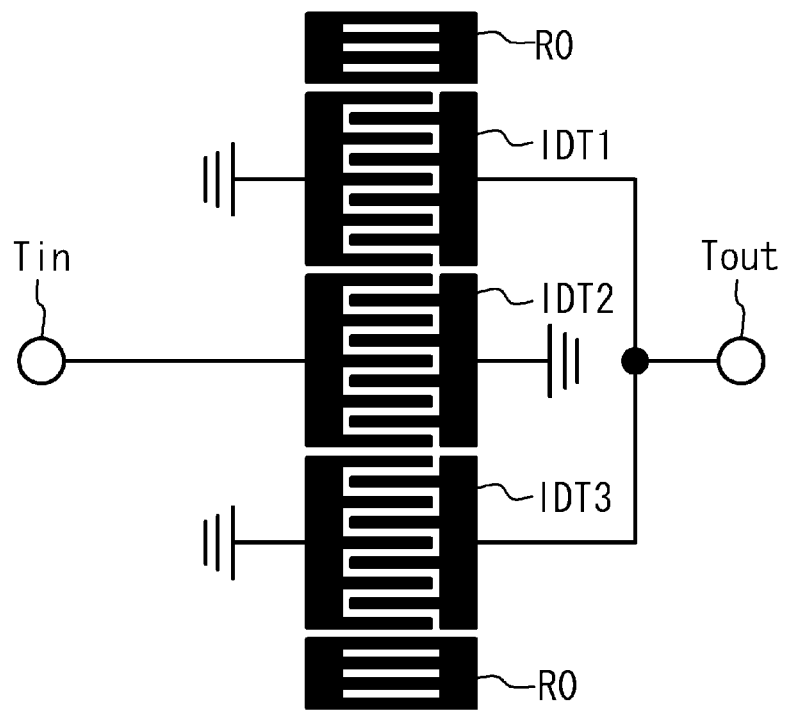
FIG. 10A illustrates an example of a plane view of a longitudinal coupling type acoustic wave resonator filter using a surface acoustic wave, a love wave and a boundary acoustic wave.

Next, a description will be given of the longitudinal coupling type acoustic wave resonator in detail. FIG. 10A illustrates an example of a plane view of a longitudinal coupling type acoustic wave resonator using a surface acoustic wave, a love wave and a boundary acoustic wave. As illustrated in FIG. 10A, IDT1 through IDT3 are arrayed in a propagation direction of an acoustic wave between the reflectors R0. One of comb-like electrodes of the IDT2 is connected to the input terminal Tin. The other is grounded. One of the comb-like electrodes of each of the IDT1 and the IDT3 is connected to the output terminal Tout. The other of each of the IDT1 and the IDT3 is grounded.

Figure 10B:
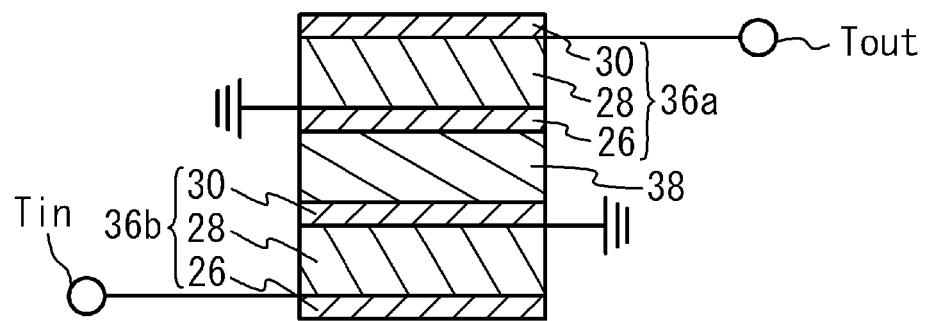
FIG. 10B illustrates a cross sectional view of a longitudinal coupling type acoustic wave resonator filter using a bulk acoustic wave.

FIG. 10B illustrates a cross sectional view of a longitudinal coupling type acoustic wave resonator using a bulk acoustic wave. As illustrated in FIG. 10B, piezoelectric thin film resonators 36a and 36b having the piezoelectric film 28 and the lower electrode 26 and the upper electrode 30 that sandwich the piezoelectric film 28 are laminated. A dielectric film 38 is provided between the piezoelectric thin film resonators 36a and 36b. The upper electrode 30 of the piezoelectric thin film resonator 36a is connected to the output terminal Tout. The lower electrode 26 of the piezoelectric thin film resonator 36a is grounded. The upper electrode 30 of the piezoelectric thin film resonator 36b is grounded. The lower electrode 26 of the piezoelectric thin film resonator 36b is connected to the input terminal Tin. The output of the longitudinal coupling type acoustic wave resonator illustrated in FIG. 10A and FIG. 10B is an unbalanced output. However the output may be a balanced output.

Figure 11A:
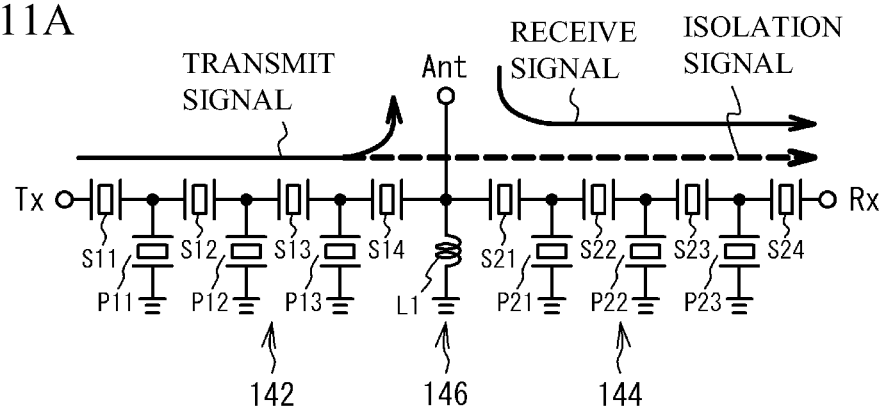
FIG. 11A illustrates a circuit diagram of a duplexer in accordance with a first comparative example.
Figure 11B:
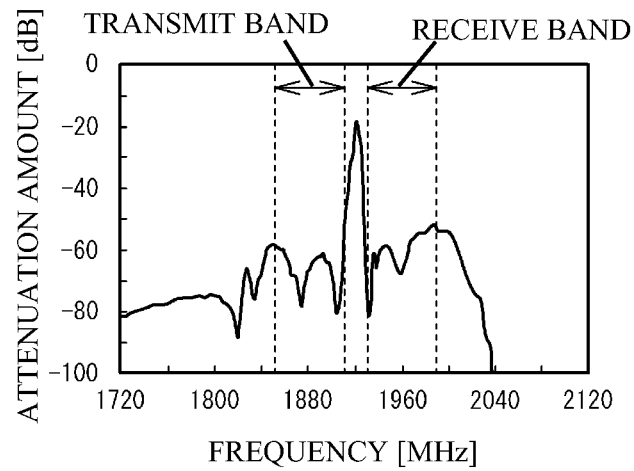
FIG. 11B and FIG. 11C illustrate an example of isolation characteristic.
Figure 11C:
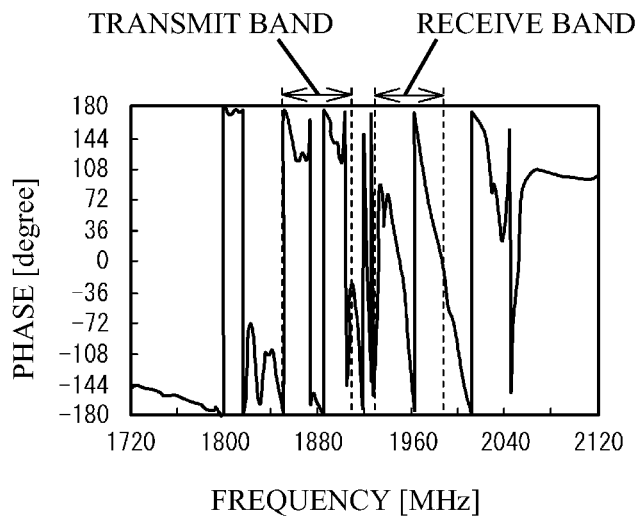

A description will be given of a duplexer in accordance with a first comparative example. The duplexer of the first comparative example is a duplexer used in a North America PCS (Personal Communications Service) of which transmit band is 1850 MHz to 1910 MHz and of which receive band is 1930 MHz to 1990 MHz. FIG. 11A illustrates a circuit diagram of the duplexer of the first comparative example. FIG. 11B and FIG. 11C illustrate an example of isolation characteristic. As illustrated in FIG. 11A, in the duplexer of the first comparative example, a ladder type acoustic wave filter is used as a transmit filter 142 and a receive filter 144. The transmit filter 142 has series resonators S11 through S14 and parallel resonators P11 through P13. The receive filter 144 has series resonators S21 through S24 and parallel resonators P21 through P23. A matching circuit 146 has an inductor L1 connected between the antenna terminal Ant and the ground. A transmit signal input to the transmit terminal Tx passes through the transmit filter 142. A large part of the transmit signal is output from the antenna terminal Ant. A part of the transmit signal is output to the receive terminal Rx as an isolation signal. A receive signal input to the antenna terminal Ant passes through the receive filter 144 and is output to the receive terminal Rx.

FIG. 11B illustrates a simulation result of amplitude characteristic of the isolation signal. FIG. 11C illustrates a simulation result of phase characteristic of the isolation signal. As illustrated in FIG. 11B and FIG. 11C, in the transmit band and the receive band, suppression degree of the isolation signal is small, and the phase fluctuates greatly.

When a signal path having amplitude similar to the amplitude of FIG. 11B and having an opposite phase with respect to the phase of FIG. 11C is generated in the transmit band and the receive band, it is thought that the isolation signal is canceled and the amplitude of the isolation signal is reduced. A signal path intentionally generating a signal having amplitude similar to an isolation signal and having an opposite phase with respect to the isolation signal in the transmit band and the receive band is called a cancel path. A circuit structuring the cancel path is called a cancel circuit.

Figure 12A:
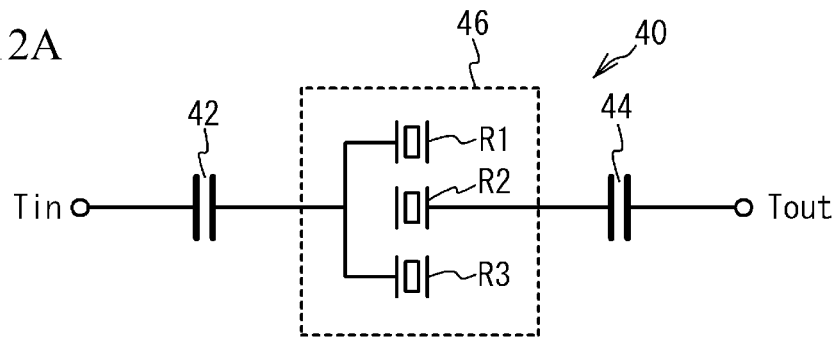
FIG. 12A illustrates an example of a circuit diagram of a cancel circuit.
Figure 12B:
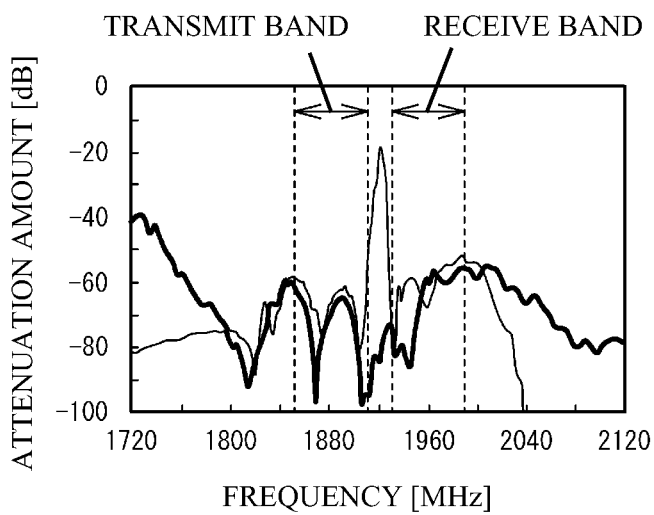
FIG. 12B and FIG. 12C illustrate an example of characteristic of a signal having passed thorough a cancel circuit.
Figure 12C:
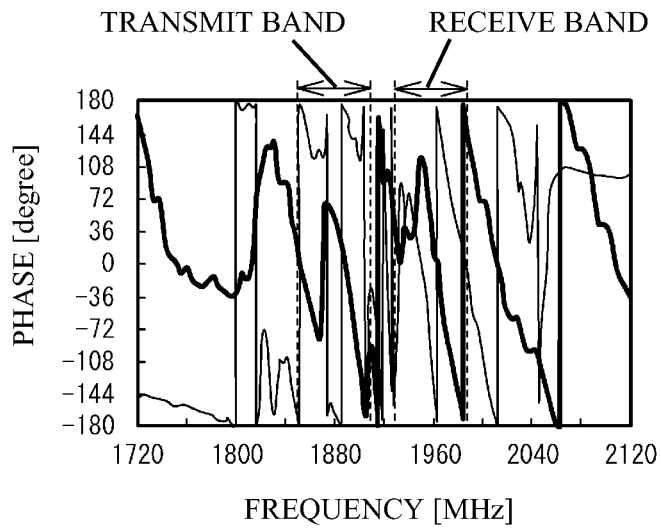

The present inventors have researched and found that the cancel path can be generated with use of a longitudinal coupling type acoustic wave resonator. FIG. 12A illustrates an example of a circuit diagram of the cancel circuit. FIG. 12B and FIG. 12C illustrate an example of characteristic of a signal having passed thorough the cancel circuit. As illustrated in FIG. 12A, a cancel circuit 40 has electrostatic capacitors 42 and 44 and the longitudinal coupling type acoustic wave resonator 46 connected in series between the input terminal Tin and the output terminal Tout. The electrostatic capacitor 42 is connected to an input side of the longitudinal coupling type acoustic wave resonator 46. The electrostatic capacitor 44 is connected to an output side of the longitudinal coupling type acoustic wave resonator 46.

The longitudinal coupling type acoustic wave resonator 46 has three acoustic wave resonators R1 through R3, is a longitudinal coupling type acoustic wave resonator using a surface acoustic wave, a love wave, a boundary acoustic wave or the like, and has the same structure as FIG. 10A. That is, the longitudinal coupling type acoustic wave resonator 46 has a structure in which the three IDTs are arrayed in a propagation direction of an acoustic wave between the reflectors. The amplitude and the phase of a signal having passed through the cancel circuit 40 can be adjusted by adjusting at least one of an interval between the acoustic wave resonators R1 through R3 (that is, an interval between an input IDT and an output IDT), a pitch of electrode fingers of the acoustic wave resonators R1 through R3, and an opening length of the acoustic wave resonators R1 through R3. The pitch of electrode fingers may be adjusted so that a single IDT has a plurality of pitches of electrode fingers. A longitudinal coupling type acoustic wave resonator using a bulk wave of FIG. 10B may be used as the longitudinal coupling type acoustic wave resonator 46. In this case, the amplitude and the phase of the signal having passed through the cancel circuit 40 may be adjusted by adjusting the thickness of the dielectric film 38.

FIG. 12B illustrates a simulation result of amplitude characteristic of a signal having passed through a cancel circuit. FIG. 12C illustrates a simulation result of the phase characteristic. In FIG. 12B and FIG. 12C, a thick line indicates the signal having passed through the cancel circuit, and a thin line indicates the isolation signal of the duplexer of the first comparative example. As illustrated in FIG. 12B and FIG. 12C, the signal having passed through the cancel circuit 40 has amplitude similar to the isolation signal and has an opposite phase with respect to the isolation signal in the transmit band and the receive band, when the interval between the input IDT and the output IDT, the pitch of electrode fingers and the opening length of the longitudinal coupling type acoustic wave resonator 46 are adjusted. The longitudinal coupling type acoustic wave resonator has a merit that the phase is easily adjusted by adjusting the interval between the input IDT and the output IDT or the like. And so, a description will be given of a duplexer in accordance with a first embodiment in which the cancel circuit is used and the isolation characteristic is improved.

Figure 13:
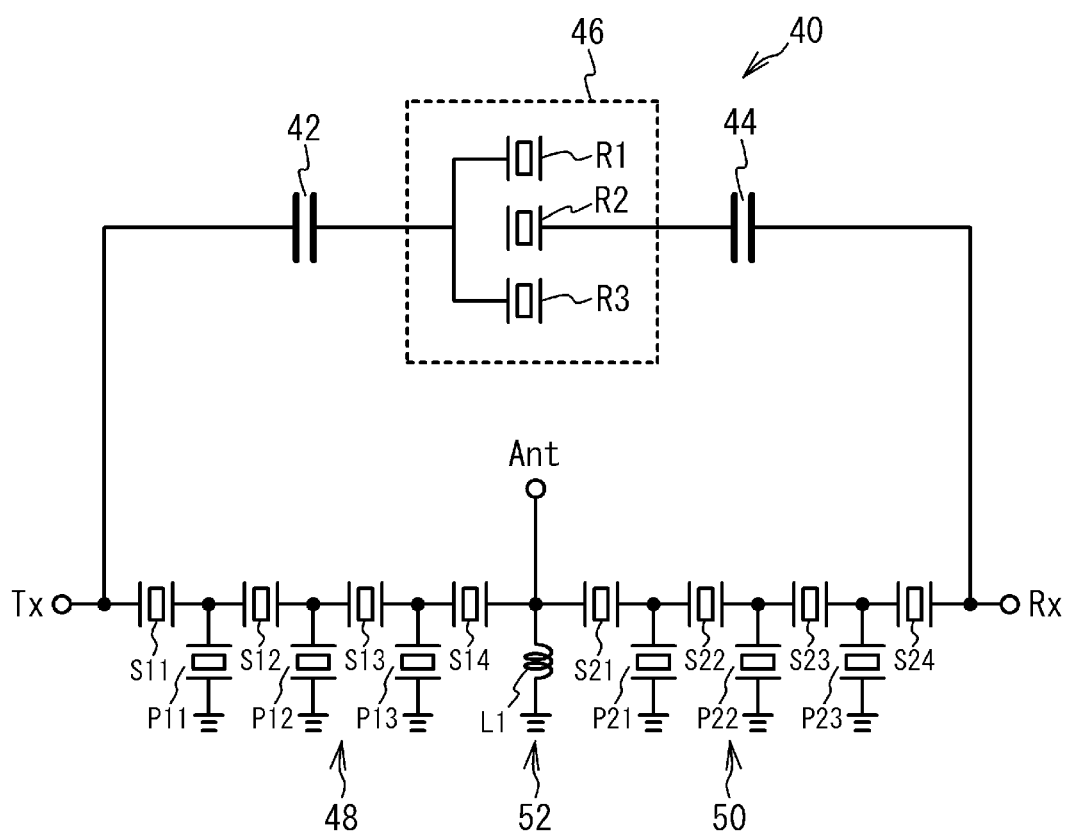
FIG. 13 illustrates an example of a circuit diagram of a duplexer in accordance with the first embodiment.

FIG. 13 illustrates an example of a circuit diagram of the duplexer of the first embodiment. The duplexer of the first embodiment is also a duplexer used in the North America PCS. As illustrated in FIG. 13, in the duplexer of the first embodiment, the ladder type acoustic wave filter is used as a transmit filter 48 and a receive filter 50. The transmit filter 48, the receive filter 50 and a matching circuit 52 have the same structure as the first comparative example. Therefore, an explanation is omitted. The cancel circuit 40 is connected between a node between the series resonator S11 and the transmit terminal Tx and a node between the series resonator S24 and the receive terminal Rx, the series resonator S11 being the closest to the transmit terminal Tx in the resonators of the transmit filter 48, the series resonator S24 being the closest to the receive terminal Rx in the resonators of the receive filter 50. That is, the cancel circuit 40 is connected in parallel with the series resonators S11 through S14 of the transmit filter 48 and the series resonators S21 through S24 of the receive filter 50, between the transmit terminal Tx and the receive terminal Rx. The cancel circuit 40 has the same structure as FIG. 12A. Therefore, an explanation is omitted.

Figure 14A:
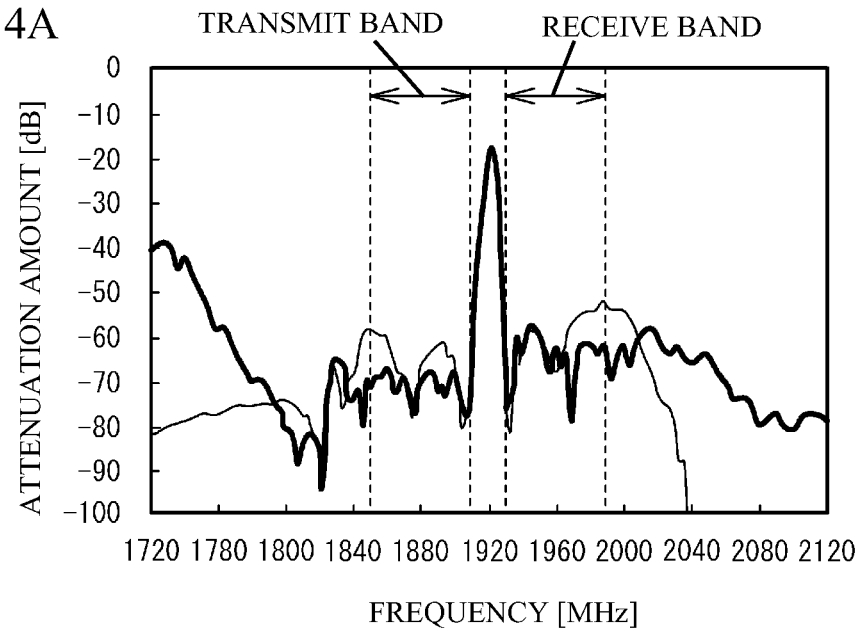
FIG. 14A illustrates a simulation result of isolation characteristic of a duplexer in accordance with the first embodiment.
Figure 14B:
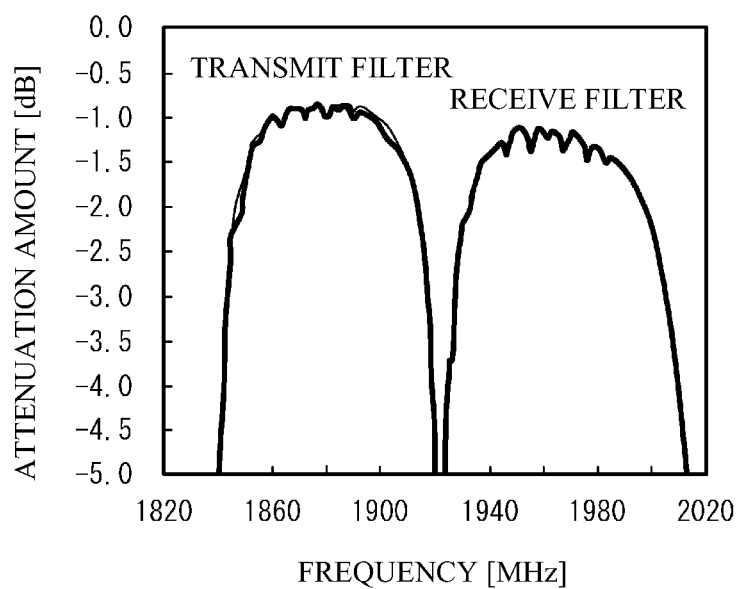
FIG. 14B illustrates a simulation result of insertion loss.

FIG. 14A illustrates a simulation result of the amplitude characteristic of the isolation signal of the duplexer of the first embodiment. FIG. 14B illustrates a simulation result of insertion loss. In FIG. 14A and FIG. 14B, the simulation result of the duplexer of the first comparative example is also illustrated, for comparison. A thick line indicates the simulation result of the first embodiment. A thin line indicates the simulation result of the first comparative example. As illustrated in FIG. 12B and FIG. 12C, the signal having passed through the cancel circuit 40 has amplitude characteristic similar to the isolation signal and has almost opposite phase with respect to the isolation signal, when a parameter of the longitudinal coupling type acoustic wave resonator 46 of the cancel circuit 40 is adequately adjusted. Thus, the signal having passed through the cancel circuit 40 is capable of canceling the isolation signal. As illustrated in FIG. 14A, in the first embodiment, the isolation is improved by approximately 10 dB in the transmit band and the receive band, compared to the first comparative example.

As illustrated in FIG. 14B, there is little difference between the first embodiment and the first comparative example, with respect to the insertion loss of the transmit filter 48 and the receive filter 50. That is, even if the cancel circuit 40 is connected, the insertion loss hardly increases. This is because input output impedance of the cancel circuit 40 is increased and a signal amount flowing into the cancel circuit 40 is suppressed when the electrostatic capacitors 42 and 44 are connected to the longitudinal coupling type acoustic wave resonator 46 in series. Therefore, it is preferable that the capacitance of the electrostatic capacitors 42 and 44 is determined in view of the signal amount flowing into the cancel circuit 40 and the amplitude of the signal having passed through the cancel path.

As described above, in accordance with the first embodiment, the cancel circuit 40 including the longitudinal coupling type acoustic wave resonator 46 is connected between the transmit terminal Tx and the receive terminal Rx in parallel with the transmit filter 48 and the receive filter 50. Thus, it is possible to improve the isolation characteristic of the duplexer without increasing insertion loss, by connecting the cancel circuit 40 in parallel with at least one of the acoustic wave resonators of the transmit filter 48 and the receive filter 50.

Figure 15A:
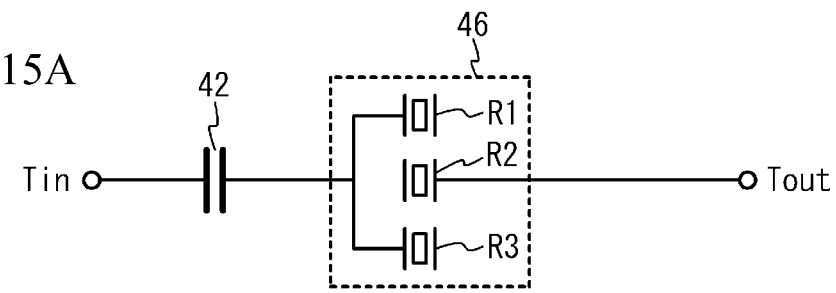
FIG. 15A through FIG. 15E illustrate a modified embodiment of a cancel circuit.
Figure 15B:
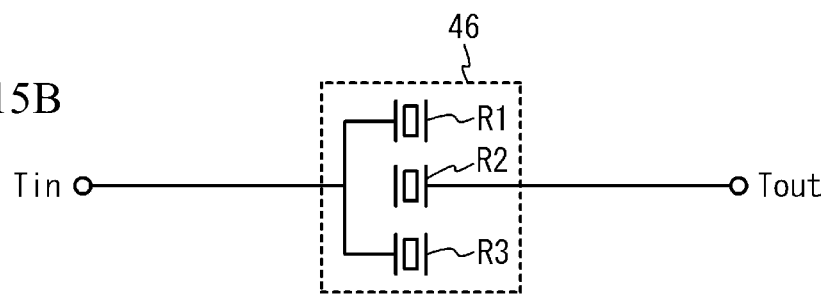
Figure 15C:
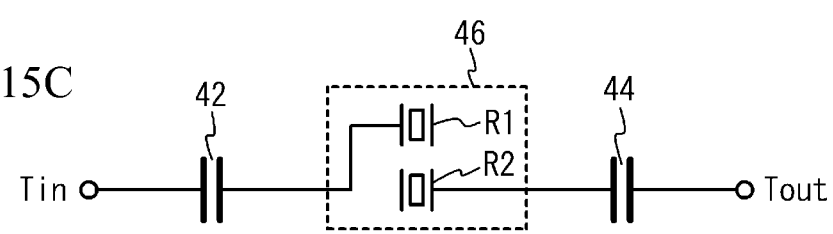

The cancel circuit 40 is not limited to the structure of FIG. 12A. The cancel circuit 40 may have a structure in accordance with modified embodiments illustrated in FIG. 15A through FIG. 15E. As illustrated in FIG. 15A, the electrostatic capacitor 44 on the output side may not be connected. As illustrated in FIG. 15B, any of the electrostatic capacitor 42 on the input side and the electrostatic capacitor 44 on the output side may not be connected. In the case of FIG. 15B, any of the electrostatic capacitors 42 and 44 are not connected. It is therefore required that the input output impedance of the cancel circuit 40 is enhanced when the longitudinal coupling type acoustic wave resonator 46 is designed. As illustrated in FIG. 15C, the longitudinal coupling type acoustic wave resonator 46 may have two acoustic wave resonators R1 and R2. That is, at least two IDTs have only to be arrayed in a propagation direction of an acoustic wave between the reflectors in the longitudinal coupling type acoustic wave resonator 46.

Figure 15D:
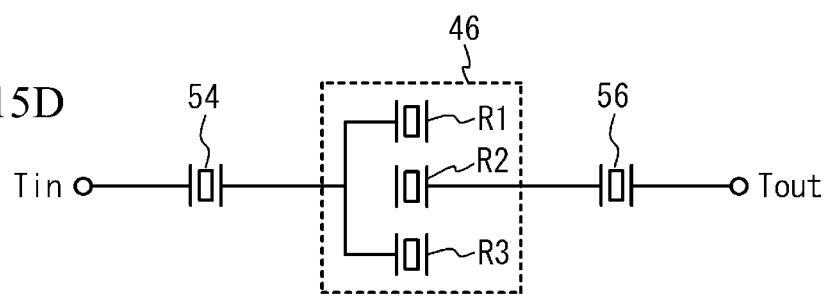
Figure 15E:
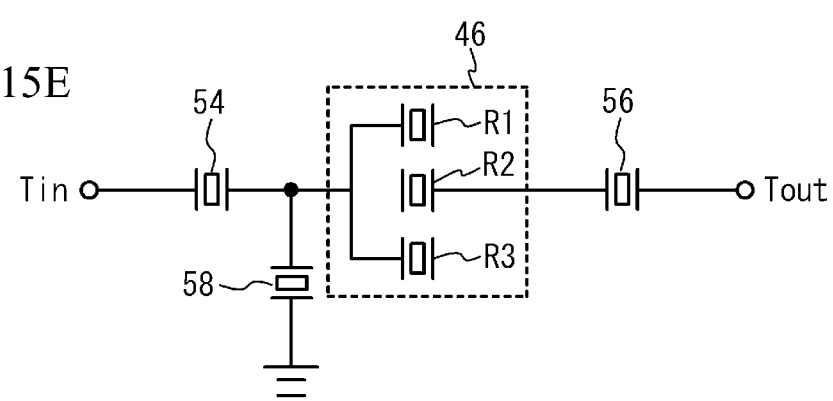

As illustrated in FIG. 15D, acoustic wave resonators 54 and 56 may be connected instead of the electrostatic capacitors 42 and 44. Adjusting a resonance frequency of the acoustic wave resonators 54 and 56 suppress the signal amount flowing into the cancel circuit. As illustrated in FIG. 15E, an acoustic wave resonator 58 may be connected between a node between the acoustic wave resonator 54 and the longitudinal coupling type acoustic wave resonator 46 and the ground. Thus, the electrical power supplied to the longitudinal coupling type acoustic wave resonator 46 is suppressed, and the power durability can be improved.

Figure 16:
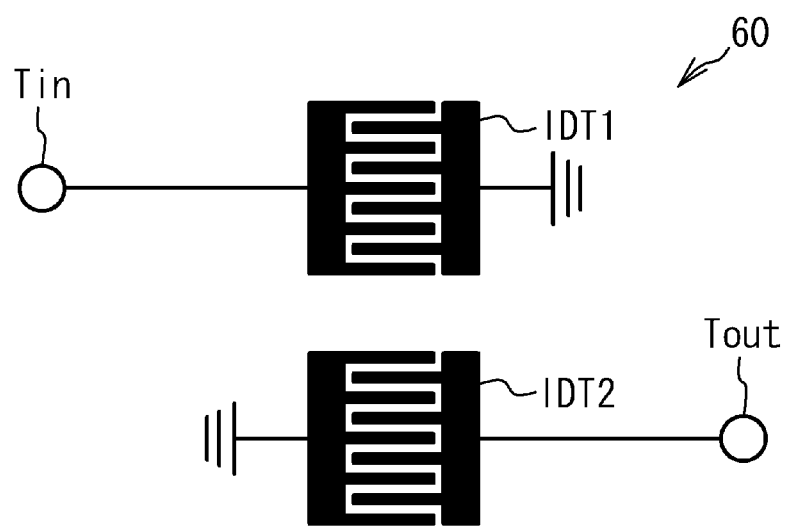
FIG. 16 illustrates an example of a plane view of an acoustic wave delay line.

An acoustic wave delay line may be used instead of the longitudinal coupling type acoustic wave resonator 46, in the cancel circuit 40. FIG. 16 illustrates an example of a plane view of an acoustic wave delay line 60. As illustrated in FIG. 16, the acoustic wave delay line 60 has at least two IDTs (an IDT1 and an IDT2). One of comb-like electrodes of the IDT1 is connected to the input terminal Tin. The other is grounded. One of comb-like electrodes of the IDT2 is connected to the output terminal Tout. The other is grounded. The IDT1 and the IDT2 are arrayed in a propagation direction of an acoustic wave. There is no reflector outside of the IDT1 and the IDT2. That is, the acoustic wave delay line 60 is not resonated. Even if the acoustic wave delay line 60 is used, the signal having passed through the cancel circuit 40 has approximately the same amplitude as the isolation signal and has an approximately opposite phase with respect to the isolation signal, when the interval between the input IDT and the output IDT, a pitch of electrode fingers and an opening length are adequately adjusted. And, the amplitude and the phase may be adjusted by changing the structure of an apodize adequately.

Therefore, to summarize the descriptions of FIG. 12A and FIG. 15A through FIG. 16, the cancel circuit 40 has only to have an acoustic wave delay line or a longitudinal coupling type acoustic wave resonator that have at least two IDTs. It is preferable that an acoustic wave resonator or an electrostatic capacitor is connected to at least one of an input side or an output side of an acoustic wave delay line or a longitudinal coupling type acoustic wave resonator in series with the acoustic wave delay line or the longitudinal coupling type acoustic wave resonator. It is more preferable that the acoustic wave resonator or the electrostatic capacitor is connected to both of the input side and the output side of the acoustic wave delay line or the longitudinal coupling type acoustic wave resonator in series with the acoustic wave delay line or the longitudinal coupling type acoustic wave resonator. When the acoustic wave resonator or the electrostatic capacitor is connected to at least the input side and the output side in series, increase of the insertion loss is easily restrained. When the acoustic wave resonator or the electrostatic capacitor is connected to both of the input side and the output side in series, the increase of the insertion loss is restrained more easily. Further, it is preferable that an acoustic wave resonator or an electrostatic capacitor is connected between a node between an acoustic wave delay line or a longitudinal coupling type acoustic wave resonator and another acoustic wave resonator or another electrostatic capacitor connected in series with the acoustic wave delay line or the longitudinal coupling type acoustic wave resonator and a ground in parallel with the acoustic wave delay line or the longitudinal coupling type acoustic wave resonator. Thus, the electrical power supplied to the acoustic wave delay line or the longitudinal coupling type acoustic wave resonator is suppressed, and the power durability is improved.

Figure 17A:
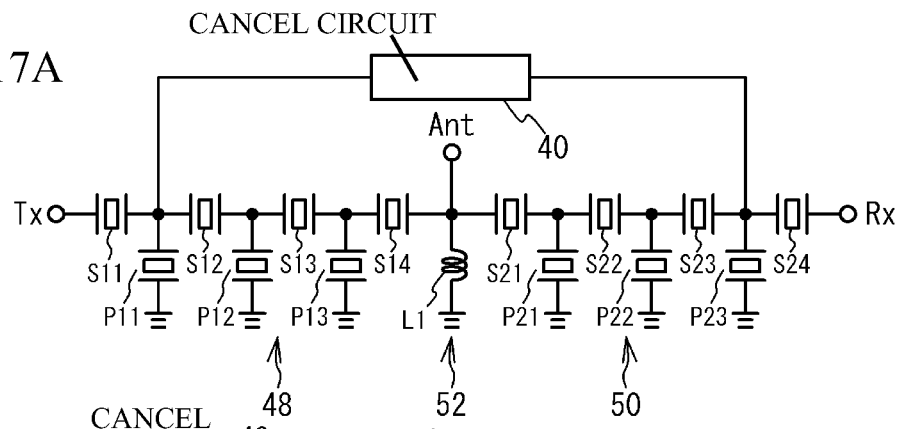
FIG. 17A through FIG. 17D illustrate a connection example of a cancel circuit.
Figure 17B:
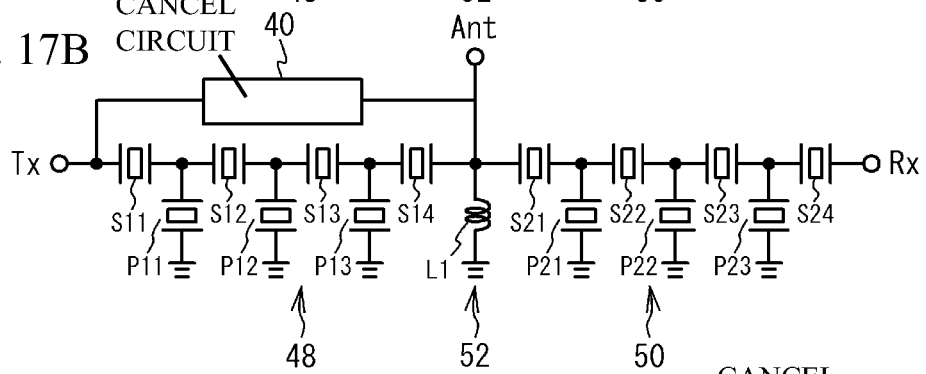
Figure 17C:
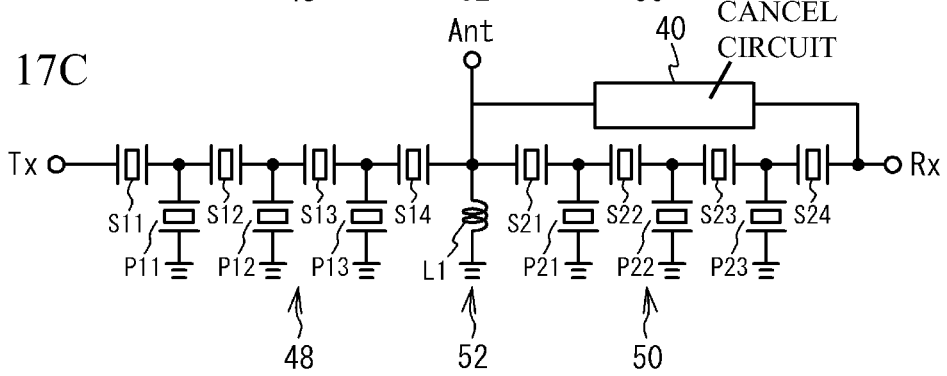
Figure 17D:
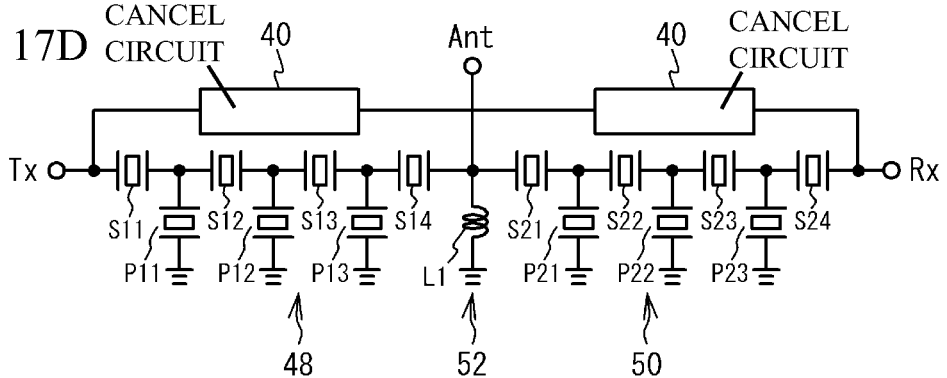

The cancel circuit 40 is not limited to the structure illustrated in FIG. 13. The cancel circuit 40 may have a connection structure illustrated in FIG. 17A through FIG. 17D. As illustrated in FIG. 17A, the cancel circuit 40 may be connected between an arbitrary node in the transmit filter 48 and an arbitrary node in the receive filter 50. As illustrated in FIG. 17B, the cancel circuit 40 may be connected between the transmit terminal Tx and the antenna terminal Ant in parallel with the transmit filter 48. In this case, the attenuation characteristic of the transmit filter 48 is improved. Therefore, the isolation characteristic of the receive band can be improved by increasing suppression degree of the receive band. As illustrated in FIG. 17C, the cancel circuit 40 may be connected between the receive terminal Rx and the antenna terminal Ant in parallel with the receive filter 50. In this case, the attenuation characteristic of the receive filter 50 is improved. Therefore, the isolation characteristic of the transmit band can be improved, by increasing the suppression degree of the transmit band. As illustrated in FIG. 17D, there may be a single cancel circuit 40 connected between the transmit terminal Tx and the antenna terminal Ant in parallel with the transmit filter 48. There may be a single cancel circuit 40 connected between the receive terminal Rx and the antenna terminal Ant in parallel with the receive filter 50. That is, there may be provided a plurality of the cancel circuits 40. Thus, the cancel circuit 40 may be connected between various nodes of a duplexer. The cancel circuit 40 may be connected in parallel with one of the acoustic wave resonators of the transmit filter 48 and the receive filter 50.

Figure 18A:
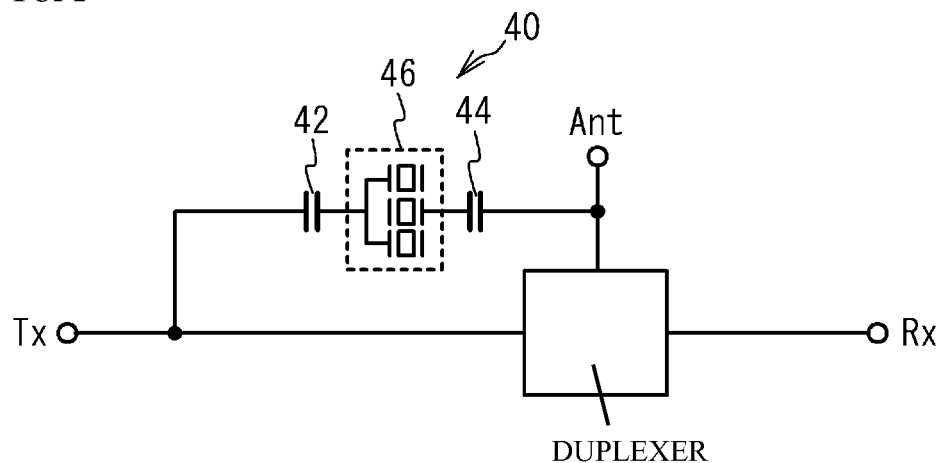
FIG. 18A illustrates an example of a duplexer used for a simulation.

Here, a description will be given of filter characteristic of the transmit filter in a case where the cancel circuit is connected between the transmit terminal and the antenna terminal. FIG. 18A illustrates a case where a duplexer is used for a simulation. The duplexer used for the simulation is a duplexer covering a Band 1 of W-CDMA (Wideband Code Division Multiple Access) system of which transmit band is 1920 MHz to 1980 MHz and of which receive band is 2110 MHz to 2170 MHz. As illustrated in FIG. 18A, the cancel circuit 40 having the electrostatic capacitors 42 and 44 and the longitudinal coupling type acoustic wave resonator 46 is connected between the transmit terminal Tx and the antenna terminal Ant in parallel with the transmit filter.

Figure 18B:
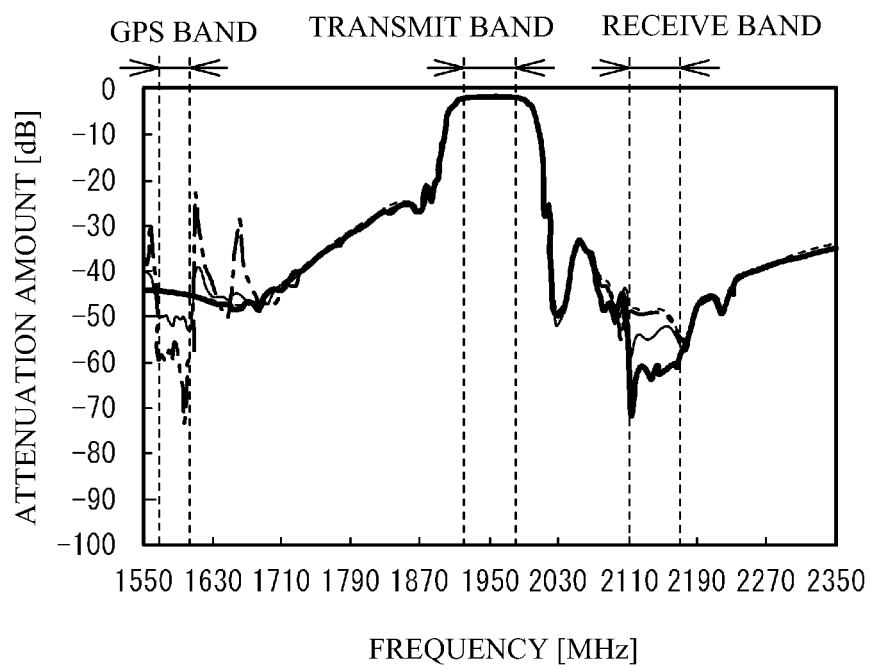
FIG. 18B illustrates a simulation result of filter characteristic of a transmit filter.

Three types of simulations, in which the parameters of the longitudinal coupling type acoustic wave resonator 46 (the interval between the input IDT and the output IDT, the pitch of electrode fingers and the opening length) are changed, was performed with respect to the duplexer. FIG. 18B illustrates a simulation result of the filter characteristic of the transmit filter. In FIG. 18B, a thick line, a thin line and a dashed-dotted line respectively indicate the three types of simulations. For comparison, another simulation of the filter characteristic of the transmit filter was performed with respect to a case where the cancel circuit 40 was not connected. A broken line indicates the result. As illustrated in FIG. 18B, it is found that the suppression degree of the GPS (Global Positioning System) band (1565 MHz to 1585 MHz) is greatly improved, the suppression degree of the receive band is greatly improved, and both of the suppression degrees of the GPS band and the receive band are greatly improved, according to the setting of the parameters of the longitudinal coupling type acoustic wave resonator 46. And, the insertion loss of the transmit band was not increased even if the cancel circuit 40 was connected.

Therefore, it is found that using of the cancel circuit 40 improves the isolation characteristic of the duplexer and the attenuation characteristic of the filter. That is, it is possible to improve the attenuation characteristic of the filter without increasing of the insertion loss, when the filter has a plurality of acoustic wave resonators and a cancel circuit connected in parallel with at least one of the acoustic wave resonators. The transmit filter 48 of FIG. 17B, the receive filter 50 of FIG. 17C, the transmit filter 48 and the receive filter 50 of FIG. 17C may be used as the filter.

A filter may have a structure in which an acoustic wave resonator or an electrostatic capacitor is connected to at least one of an input side and an output side of an acoustic wave delay line or a longitudinal coupling type acoustic wave resonator in series with the acoustic wave delay line or the longitudinal coupling type acoustic wave resonator, as well as the duplexer. The filter may have another structure in which the acoustic wave resonator or the electrostatic capacitor is connected to both of the input side and the output side of the acoustic wave delay line or the longitudinal coupling type acoustic wave resonator in series with the acoustic wave delay line or the longitudinal coupling type acoustic wave resonator. Thus, the increase of the insertion loss is easily restrained. And, an acoustic wave resonator or an electrostatic capacitor may be connected in parallel with an acoustic wave delay line or a longitudinal coupling type acoustic wave resonator between a node between the acoustic wave delay line or the longitudinal coupling type acoustic wave resonator and another acoustic wave resonator or another electrostatic capacitance connected in series with the acoustic wave delay line or the longitudinal coupling type acoustic wave resonator and the ground. Thus, the electrical power supplied to the acoustic wave delay line or the longitudinal coupling type acoustic wave resonator is suppressed, and the power durability is improved.

In a case where the filter is a balanced filter of unbalanced input and balanced output, the cancel circuit has only to be connected in parallel with an acoustic wave resonator at least one of between the input terminal and one of the output terminals and between the input terminal and the other of the output terminals. In the case, it is more preferable that the cancel circuit is connected in parallel with the acoustic wave resonator both of between the input terminal and one of the output terminals and between the input terminal and the other of the output terminals.

Figure 19:
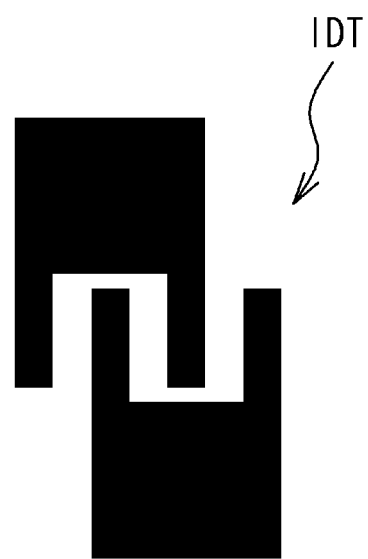
FIG. 19 illustrates a plane view of an electrostatic capacitor structured by an IDT without a reflector.

In the cancel circuit 40 of FIG. 12A, FIG. 15A and FIG. 15C, the electrostatic capacitors 42 and 44 connected to the longitudinal coupling type acoustic wave resonator 46 in series may be structured by an IDT without a reflector. When an electrostatic capacitor is connected between the electrostatic capacitor 42 and the longitudinal coupling type acoustic wave resonator 46 in parallel, the electrostatic capacitor connected in parallel may be structured by an IDT without a reflector. FIG. 19 illustrates a plane view of the electrostatic capacitor structured by the IDT without a reflector.

When the opening length of the IDT structuring the acoustic wave delay line 60 and the longitudinal coupling type acoustic wave resonator 46 is short, the power durability is degraded and the device may be broken. It is therefore preferable that the length of the opening of the IDT of the acoustic wave delay line 60 and the longitudinal coupling type acoustic wave resonator 46 is long. The length of the opening is preferably 20λ or more, and is more preferably 40λ or more. The "λ" is a wavelength of an acoustic wave.

In the first embodiment, the transmit filter 48 and the receive filter 50 are a ladder type acoustic wave filter. However, the transmit filter 48 and the receive filter 50 may have at least one of the filters illustrated in FIG. 4 through FIG. 7. At least one of the surface acoustic wave resonator, the love wave resonator, the boundary acoustic wave resonator and the piezoelectric thin film resonator may be used as the resonator included in the filter.

Second Embodiment

Figure 20A:
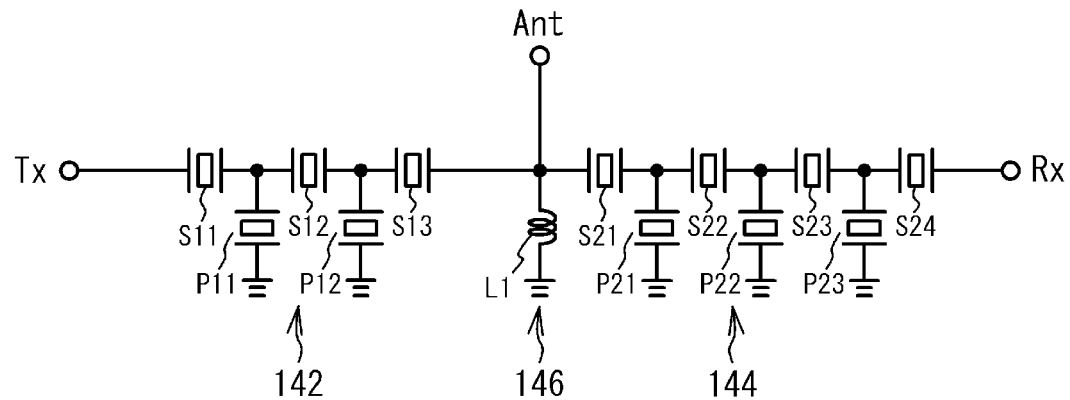
FIG. 20A illustrates an example of a circuit diagram of a duplexer in accordance with a second comparative example.
Figure 20B:
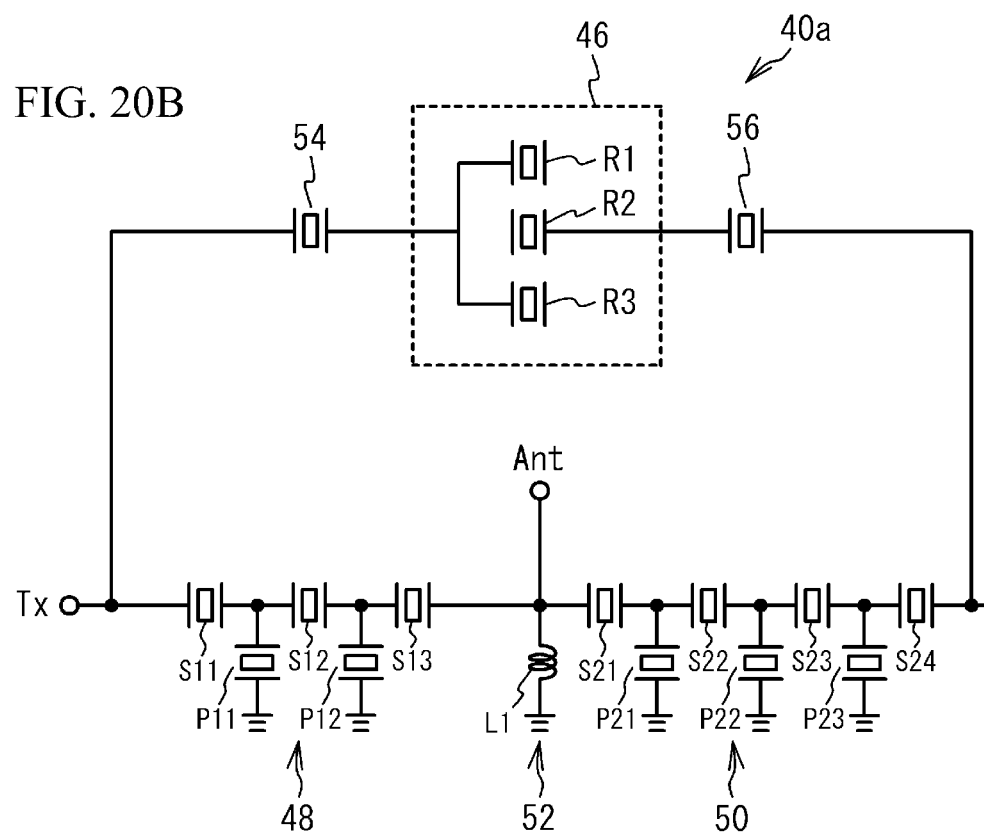
FIG. 20B illustrates an example of a circuit diagram of a duplexer in accordance with a second embodiment.

FIG. 20A illustrates an example of a circuit diagram of a duplexer in accordance with a second comparative example. FIG. 20B illustrates an example of a circuit diagram of a duplexer in accordance with a second embodiment. The duplexers of the second comparative example and the second embodiment are duplexers used for the North America PCS. As illustrated in FIG. 20A, the transmit filter 142 is a four-stage ladder type acoustic wave filter. The receive filter 144 is a six-stage ladder type acoustic wave filter. The transmit filter 142 has the series resonators S11 through S13 and the parallel resonators P11 and P12. The receive filter 144 has the series resonators S21 through S24 and the parallel resonators P21 through P23. A surface acoustic wave resonator is used as the series resonators and the parallel resonators. The matching circuit 146 has the inductor L1 connected between the antenna terminal Ant and the ground.

As illustrated in FIG. 20B, the transmit filter 48, the receive filter 50 and the matching circuit 52 have the same structure as the second comparative example. Therefore, an explanation is omitted. A cancel circuit 40a is connected in parallel with the transmit filter 48 and the receive filter 50 between the transmit terminal Tx and the receive terminal Rx. In the cancel circuit 40a, the acoustic wave resonators 54 and 56 and the longitudinal coupling type acoustic wave resonator 46 are connected in series. The acoustic wave resonator 54 is connected to the transmit terminal Tx side of the longitudinal coupling type acoustic wave resonator 46, and the acoustic wave resonator 56 is connected to the receive terminal Rx side of the longitudinal coupling type acoustic wave resonator 46. The longitudinal coupling type acoustic wave resonator 46 is structured by the three acoustic wave resonators R1 through R3. A surface acoustic wave resonator is used as the acoustic wave resonators 54, 56 and R1 through R3.

Figure 21A:
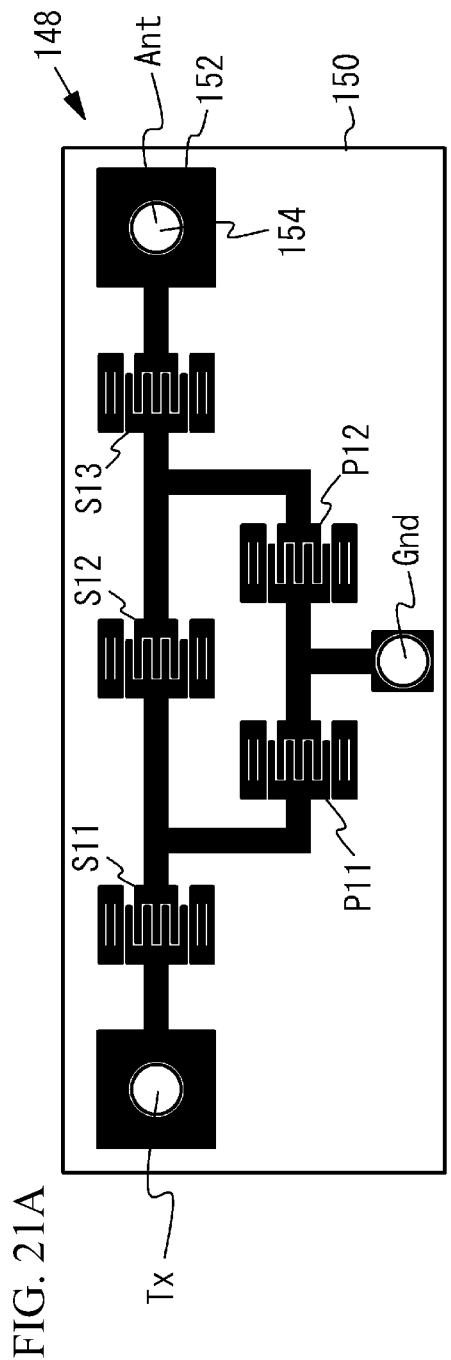
FIG. 21A illustrates an example of a plane view of a transmit filter chip of the second comparative example.
Figure 21B:
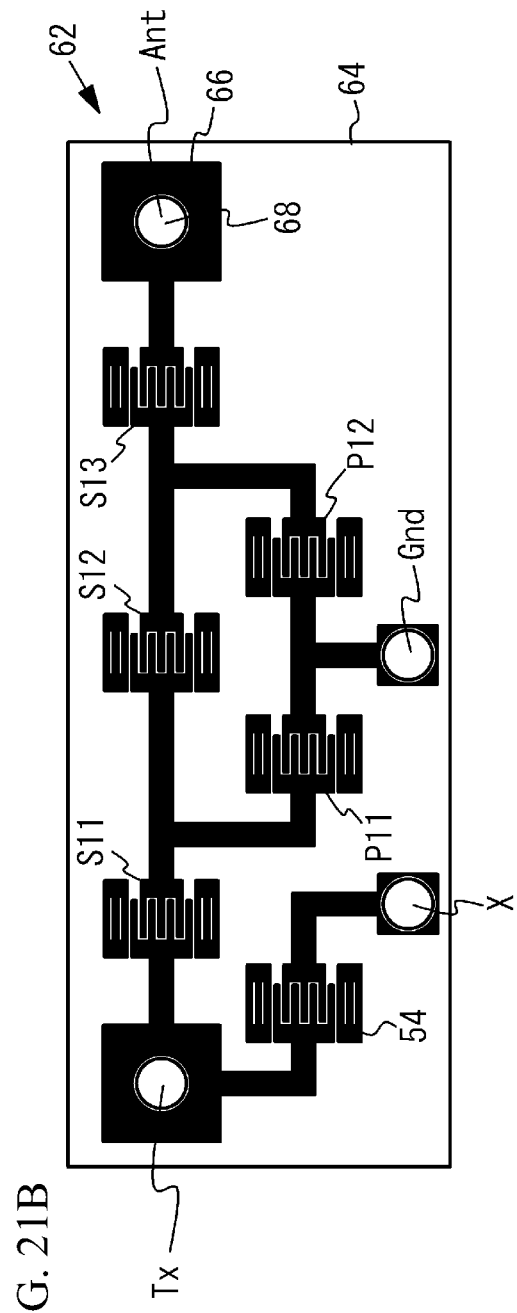
FIG. 21B illustrates an example of a plane view of a transmit filter chip of the second embodiment.

FIG. 21A illustrates an example of a plane view of a transmit filter chip of the second comparative example. FIG. 21B illustrates an example of a plane view of a transmit filter chip of the second embodiment. As illustrated in FIG. 21A and FIG. 21B, in transmit filter chips 148 and 62, a metal film composed of Al is provided on piezoelectric substrates 150 and 64 composed of LT. The metal film forms each resonator, pads 152 and 66 and interconnection lines. Bumps 154 and 68 are provided on the pads 152 and 66. A pad Ant of the pads 152 and 66 is a pad connected to the antenna terminal. A pad Tx is a pad connected to the transmit terminal. A pad Gnd is a pad connected to the ground. A pad X is a pad connected to the longitudinal coupling type acoustic wave resonator 46 of the cancel circuit 40a. Each resonator corresponds to the resonators of FIG. 20A and FIG. 20B. Thus, the acoustic wave resonator 54 in the cancel circuit 40a is provided on the transmit filter chip 62.

Figure 22A:
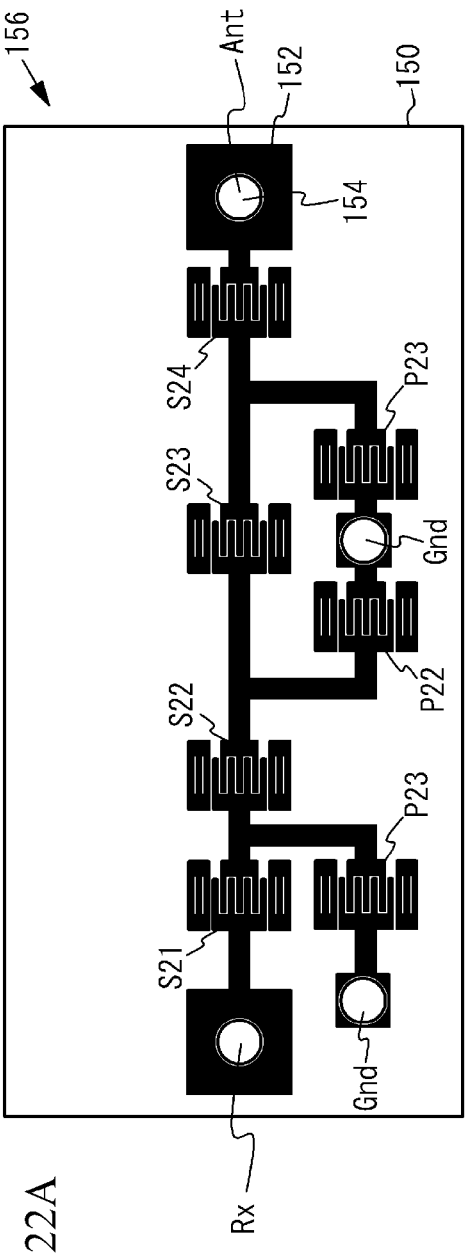
FIG. 22A illustrates an example of a plane view of a receive filter chip of the second comparative example.
Figure 22B:
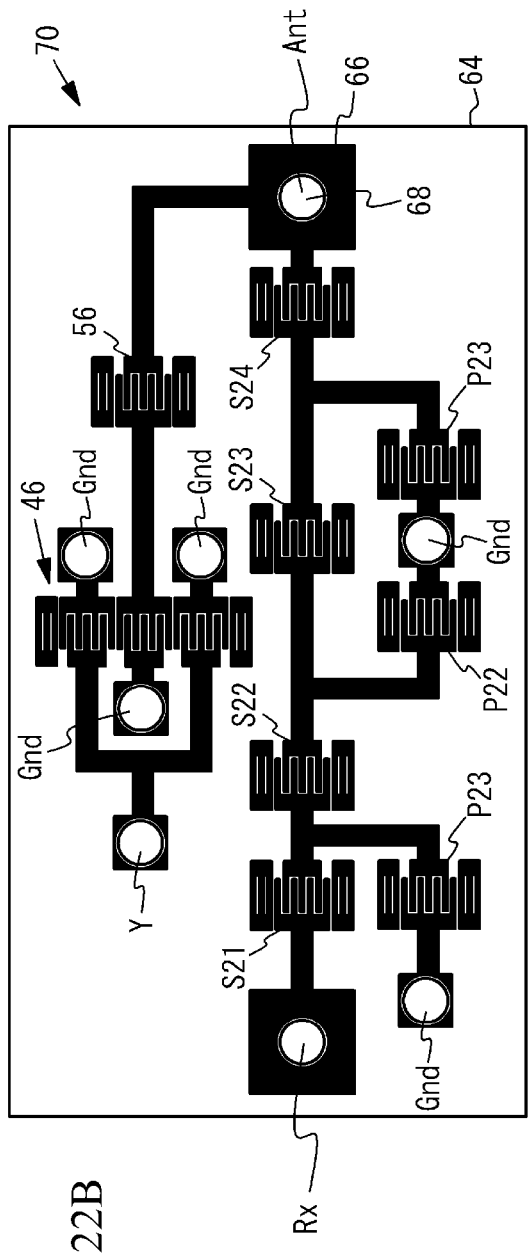
FIG. 22B illustrates an example of a plane view of a receive filter chip of the second embodiment.

FIG. 22A illustrates an example of a plane view of a receive filter chip of the second comparative example. FIG. 22B illustrates an example of a plane view of a receive filter chip of the second embodiment. As illustrated in FIG. 22A and FIG. 22B, in receive filter chips 156 and 70, a metal film composed of Al is provided on the piezoelectric substrates 150 and 64 composed of LT. The metal film forms each resonator, the pads 152 and 66 and interconnection lines. The bumps 154 and 68 are provided on the pads 152 and 66. The pad Ant of the pads 152 and 66 is a pad connected to the antenna terminal. A pad Rx is a pad connected to the receive terminal. The pad Gnd is a pad connected to the ground. A pad Y is a pad connected to the acoustic wave resonator 54 of the cancel circuit 40a. Each resonator corresponds to the resonators of FIG. 20A and FIG. 20B. Thus, the longitudinal coupling type acoustic wave resonator 46 and the acoustic wave resonator 56 in the cancel circuit 40a are provided on the receive filter chip 70.

Figure 23A:
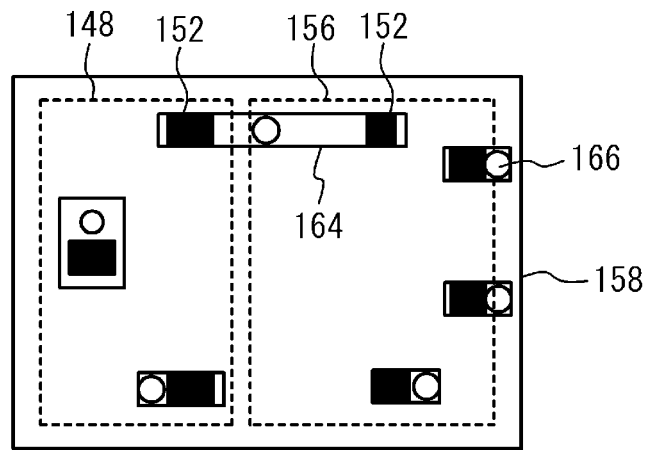
FIG. 23A through FIG. 23C illustrate examples of a plane view of a lamination substrate on which a transmit filter chip and a receive filter chip of the second comparative example are mounted.
Figure 23B:
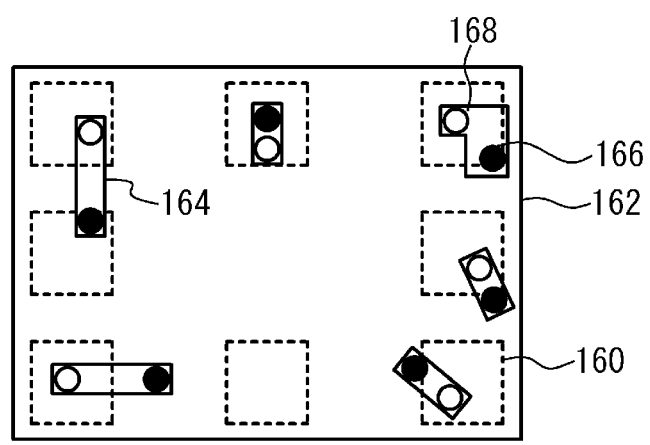
Figure 23C:
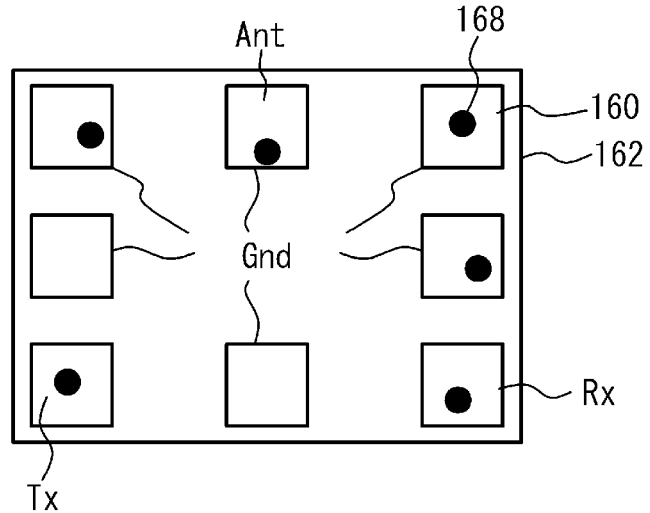
Figure 24A:
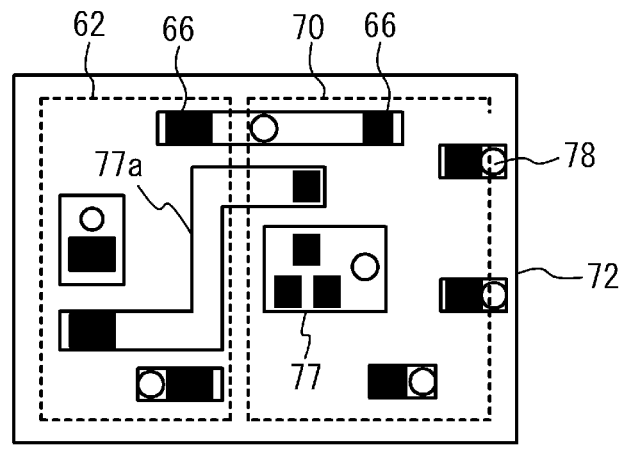
FIG. 24A through FIG. 24C illustrate examples of a plane view of a lamination substrate on which a transmit filter chip and a receive filter chip of the second embodiment are mounted.
Figure 24B:
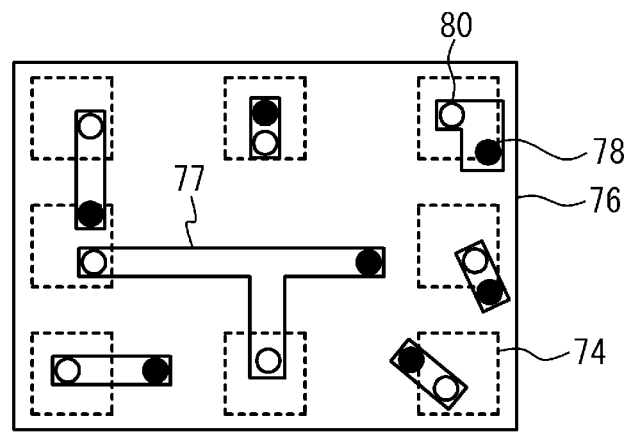
Figure 24C:
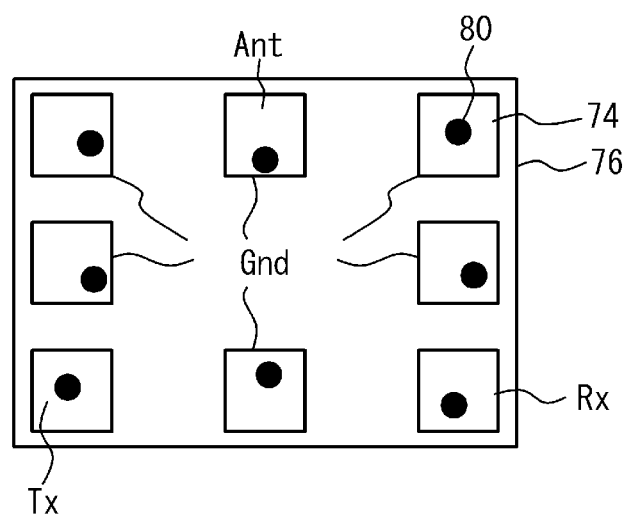

FIG. 23A through FIG. 23C illustrate examples of a plane view of a lamination substrate on which the transmit filter chip and the receive filter chip of the second comparative example are mounted. FIG. 24A through FIG. 24C illustrate examples of a plane view of a lamination substrate on which the transmit filter chip and the receive filter chip of the second embodiment are mounted. FIG. 23A and FIG. 24A illustrate an example of a top view of die attach layers 158 and 72 on which the transmit filter chips 148 and 62 and the receive filter chips 156 and 70 are flip-chip mounted. In FIG. 23A and FIG. 24A, the transmit filter chips 148 and 62 and the receive filter chips 156 and 70 are seen through. FIG. 23B and FIG. 24B illustrate examples of a top view of foot pad layers 162 and 76 having foot pads 160 and 74 provided on a lower face thereof. The foot pads 160 and 74 are seen through. A broken line indicates the foot pads 160 and 74. FIG. 23C and FIG. 24C illustrate examples in which the lower faces of the foot pad layers 162 and 76 are seen through.

As illustrated in FIG. 23A and FIG. 24A, interconnection lines 164 and 77 composed of a metal such as copper is provided on upper faces of the die attach layers 158 and 72 composed of an insulating material such as ceramics. An interconnection line 77a for the cancel circuit electrically connects the acoustic wave resonator 54 provided on the transmit filter chip 62 with the longitudinal coupling type acoustic wave resonator 46 and the acoustic wave resonator 56 provided on the receive filter chip 70. Vias 166 and 78 are vias in which a metal penetrating the die attach layers 158 and 72 are buried.

As illustrated in FIG. 23B and FIG. 24B, the interconnection lines 164 and 77 composed of a metal such as copper is provided on upper faces of the foot pad layers 162 and 76 composed of an insulating material such as ceramics. The vias 166 and 78 penetrating the die attach layers 158 and 72 are electrically connected to the interconnection lines 164 and 77. Vias 168 and 80 are vias in which a metal penetrating the foot pad layers 162 and 76 are buried.

As illustrated in FIG. 23C and FIG. 24C, the vias 168 and 80 penetrating the foot pad layers 162 and 76 are electrically connected to the foot pads 160 and 74 composed of a metal. A foot pad Ant of the foot pads 160 and 74 is a foot pad connected to the antenna terminal. A foot pad Tx is a foot pad connected to the transmit terminal Tx. A foot pad Rx is a foot pad connected to the receive terminal Rx. A foot pad Gnd is a foot pad connected to the ground.

Figure 25:
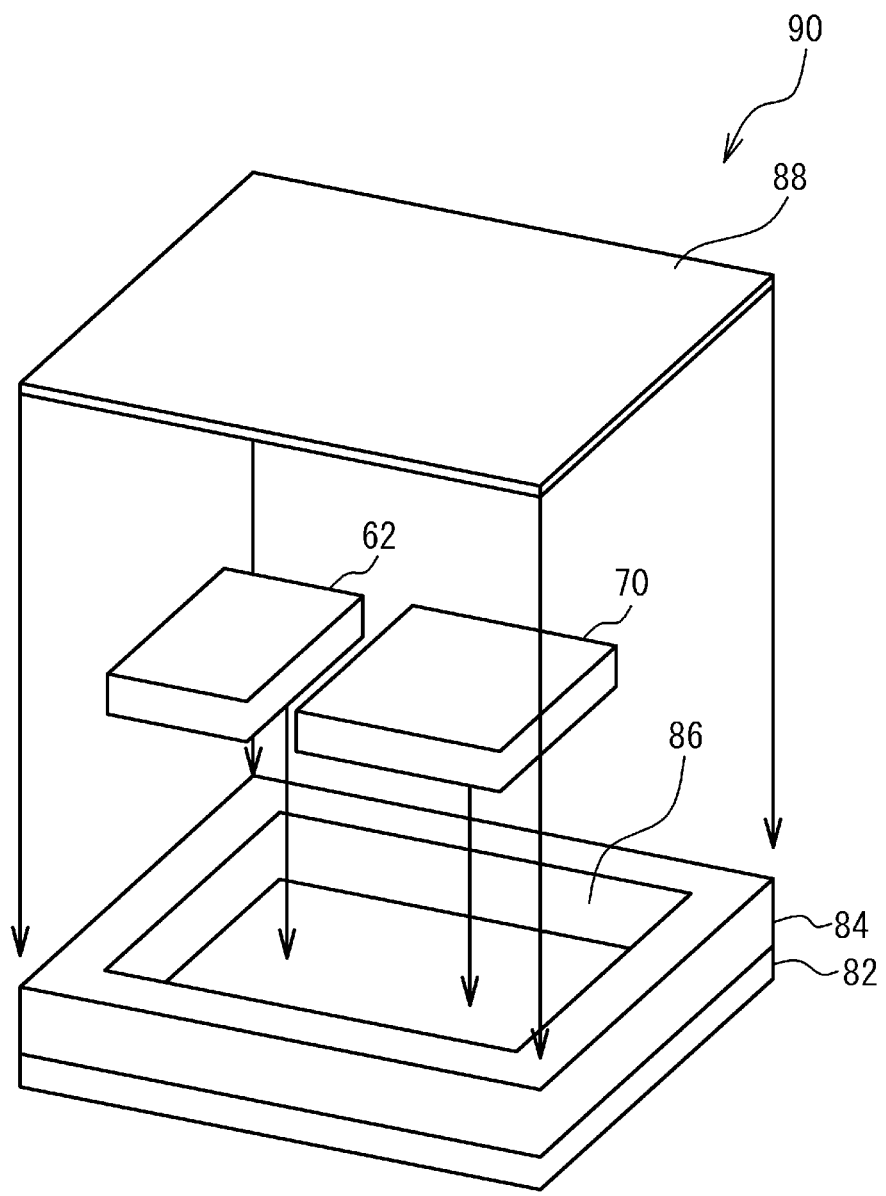
FIG. 25 illustrates an exploded perspective view of a package.

FIG. 25 illustrates an exploded perspective view of a package. As illustrated in FIG. 25, a cavity layer 84 composed of an insulating material such as ceramics is provided on a lamination substrate 82 including the die attach layer and the foot pad layer. A cavity 86 is formed in a center of the cavity layer 84. The chips 62 and 70 are flip-chip mounted on the lamination substrate 82. A lid 88 composed of a metal is fixed on the cavity layer 84. Thus, the chips 62 and 70 are sealed in the cavity 86. With the processes, a package 90 in which the chips 62 and 70 are mounted is formed.

Figure 26:
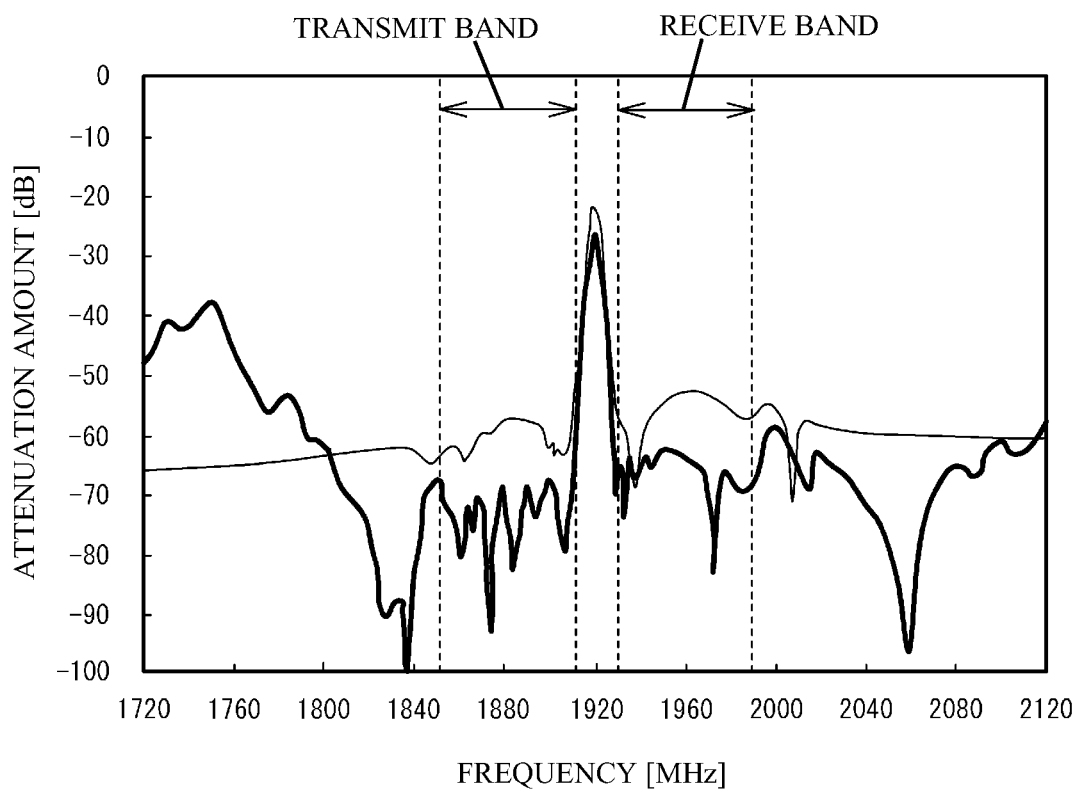
FIG. 26 illustrates a measured result of amplitude characteristic of an isolation signal of duplexers of the second comparative example and the second embodiment.

FIG. 26 illustrates a measured result of amplitude characteristic of an isolation signal of the duplexers of the second comparative example and the second embodiment. In FIG. 26, a thin line indicates the isolation signal of the second comparative example, and a thick line indicates the isolation signal of the second embodiment. As illustrated in FIG. 26, in the transmit band and the receive band, the isolation of the second embodiment is improved by approximately 10 dB compared to the second comparative example. This is because the cancel circuit 40a is connected between the transmit terminal Tx and the receive terminal Rx in parallel with the transmit filter 48 and the receive filter 50. That is the same reason as the first embodiment.

In the second embodiment, as illustrated in FIG. 21B and FIG. 22B, the acoustic wave resonator 54 connected to the transmit terminal Tx side of the longitudinal coupling type acoustic wave resonator 46 is provided on the transmit filter chip 62, and the acoustic wave resonator 56 connected to the receive terminal Rx side of the longitudinal coupling type acoustic wave resonator 46 is provided on the receive filter chip 70. The acoustic wave resonator 54 attenuates a transmit signal. It is therefore possible to electrically insulate the transmit terminal Tx from the receive terminal Rx, compared to the case where both of the acoustic wave resonators 54 and 56 are provided on the transmit filter chip 62 or the receive filter chip 70. Thus, the isolation characteristic can be more improved. The longitudinal coupling type acoustic wave resonator 46 may be provided on the transmit filter chip 62 or provided on the receive filter chip 70.

In the second embodiment, all of the longitudinal coupling type acoustic wave resonators 46 and the acoustic wave resonators 54 and 56 are provided on the transmit filter chip 62 and the receive filter chip 70. As illustrated in FIG. 16E, the acoustic wave resonator 58 may be connected between the acoustic wave resonator 54 and the longitudinal coupling type acoustic wave resonator 46 in parallel. A part of or all of the longitudinal coupling type acoustic wave resonator 46 and the acoustic wave resonators 54, 56 and 58 may be provided on the transmit filter chip 62 and the receive filter chip 70.

In the second embodiment, as well as the first embodiment, an electrostatic capacitor may be provided instead of the acoustic wave resonators 54 and 56 connected to the longitudinal coupling type acoustic wave resonator 46 in series. An acoustic wave resonator or an electrostatic capacitor may be connected between the acoustic wave resonator 54 and the longitudinal coupling type acoustic wave resonator 46 in parallel. Further, an acoustic wave delay line may be used as the longitudinal coupling type acoustic wave resonator 46.

Figure 27A:
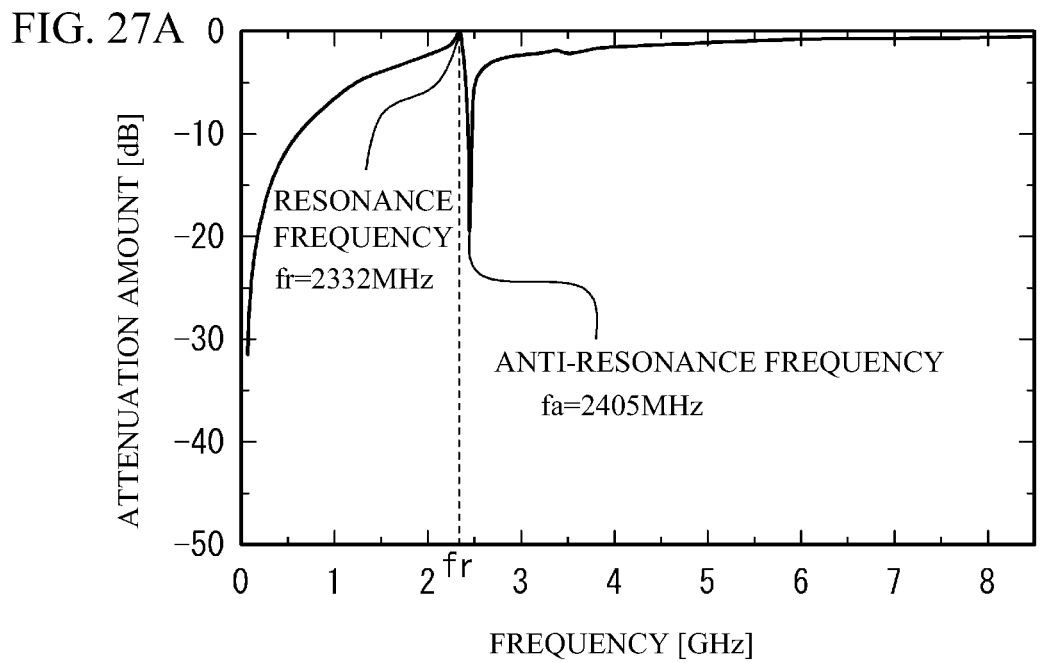
FIG. 27A illustrates a measured result of pass characteristic.
Figure 27B:
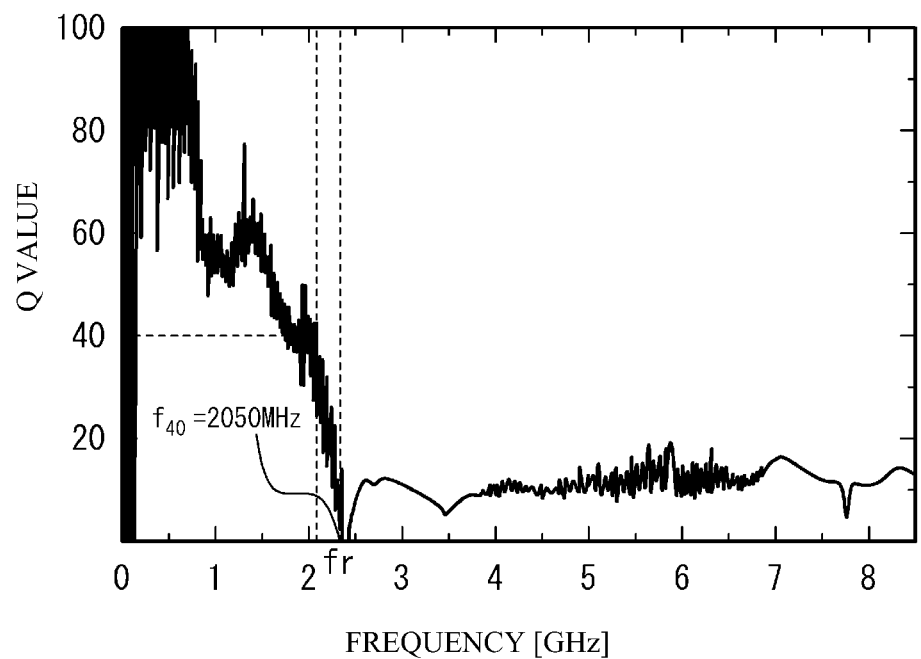
FIG. 27B illustrates a measured result of a Q value.

Here, a description will be given of a review result of a Q value of an acoustic wave resonator in the case where the acoustic wave resonator is used as a capacitor as well as the acoustic wave resonators 54 and 56. A surface acoustic wave resonator was made. In the surface acoustic wave resonator, an IDT was provided on a 42 degrees Y-cut LT substrate, the pitch "λ" of electrode fingers of the IDT was 1.62 μm, the opening length was 19.9λ, electrode pairs of the IDT was 59.5. Pass characteristic and the Q value were measured. FIG. 27A illustrates a measured result of the pass characteristic. FIG. 27B illustrates a measured result of the Q value. As illustrated in FIG. 27A, a resonance frequency fr of the acoustic wave resonator was 2332 MHz, and an anti-resonance frequency fa was 2405 MHz.

As illustrated in FIG. 27B, it is found that the Q value is zero around the resonance frequency fr. And it is found that the Q value is a low value (10 or so) at the resonance frequency fr or more. This may be because a bulk wave (an acoustic wave radiated into inside of the piezoelectric substrate) is excited from the IDT at a frequency higher than the resonance frequency fr, and the bulk wave makes a loss and causes the reduction of the Q value. On the other hand, it is found that the Q value gets higher with increasing distance from the resonance frequency fr at a frequency lower than the resonance frequency fr. For example, when the Q value is 40 or more, the loss of the signal passing through the acoustic wave resonator used as the capacitor is sufficiently suppressed. It is therefore preferable that the Q value is 40 or more. A frequency $f_{40}$ at which the Q value was 40 was 2050 MHz.

Here, a relation between the fr and the $f_{40}$ is generalized. From the result of FIG. 27B, a formula (1) is obtained.

$$fr = 1.138 \times f_{40} \qquad (1)$$

Here, it is preferable that the Q value of the acoustic wave resonators 54 and 56 is 40 or more, in the transmit band of the transmit filter 48 and the receive band of the receive filter 50. An upper limit frequency of the receive band is $f_{up}$. When the resonance frequency fr of the acoustic wave resonators 54 and 56 satisfies the formula (2), the Q value of the acoustic wave resonators 54 and 56 keeps 40 or more in the transmit band and the receive band.

$$fr > 1.138 \times f_{up} \quad (2)$$

Here, the formula (2) is described with use of the pitch of electrode fingers. A series resonator of which resonance frequency is the lowest determines the upper limit frequency of the pass band in the ladder type acoustic wave filter. That is, a series resonator of which pitch of electrode fingers is the widest determines the upper limit frequency. A pitch of electrode fingers of a resonator of which pitch of electrode fingers is the widest in the series resonators in one of the transmit filter 48 and the receive filter 50 in the duplexer of FIG. 20B having a pass band frequency higher than the other is $\lambda_{IDT}$. A pitch of electrode fingers of the acoustic wave resonators 54 and 56 is $\lambda_{cap}$. In this case, the formula (3) is obtained.

$$\lambda_{IDT} > 1.138 \times \lambda_{cap} \quad (3)$$

Therefore, when the pitch $\lambda_{cap}$ of electrode fingers of the acoustic wave resonators 54 and 56 satisfying the formula (3) is sets, the Q value of the acoustic wave resonators 54 and 56 can be 40 or more in the transmit band and the receive band. And, the loss of the signal passing through the acoustic wave resonators 54 and 56 can be suppressed.

The above description is based on the measured result of the surface acoustic wave resonator in which the IDT was provided on the 42 degrees Y-cut LT substrate, the pitch $\lambda$ of electrode fingers was 1.62 μm, the opening length was 19.9λ, and the electrode pairs of the IDT was 59.5. Similar measurement was performed with respect to other resonators. As the results, the relation of the formula (1) did not fluctuate, even if the cut angle of the LT substrate was changed from 36 degrees Y to 48 degrees Y. The relation of the formula (1) did not fluctuate, even if the pitch of electrode fingers of the resonator, the opening length and the electrode pairs of the IDT were changed.

The Q value of an electrostatic capacitor is determined as "−Im[Z]/Re[Z]". When impedance Z of a pure capacitor is Z=R+1/jωC (R is resistance, w is angular frequency, and C is electrostatic capacitance), the relation "Q=1/ωCR" is obtained. When "C" and "R" are constant, frequency dependence of the Q value is a function of 1/f type ("f" is frequency). On the other hand, the Q characteristic in the case where the electrostatic capacitor is made of a resonator is not the 1/f type, as illustrated in FIG. 27B. The reason is as follows. That is, characteristic between the resonance frequency and the anti-resonance frequency is L characteristic (dielectric). Therefore, the Q value cannot be determined. At the resonance frequency or less, the Q value gradually gets closer to "Q=1/ωCR". In a SH wave resonator using an LT substrate or an LN substrate, a bulk wave radiation occurs at a frequency a little more than the anti-resonance frequency (a cut-off frequency of a bulk wave). The loss caused by the bulk wave radiation causes radical degradation of the Q value of the electrostatic capacitor at a frequency higher than the anti-resonance frequency. With the reason, the Q characteristic in the case where the electrostatic capacitance is made of the resonator using the SH wave is illustrated in FIG. 27B, in spite of the substrate or the cut angle.

When the cancel circuit 40a is connected in parallel with the series resonator of the transmit filter 48 or the receive filter 50 as illustrated in FIG. 17B through FIG. 17D, the relation "$\lambda_{IDT} > 1.138 \times \lambda_{cap}$" has only to be satisfied when the pitch of electrode fingers of a resonator having the largest pitch of electrode fingers of the series resonators connected in parallel with the cancel circuit 40a is $\lambda_{IDT}$. When the cancel circuit 40a is connected in parallel with at least one of the series resonator of the transmit filter 48 and the receive filter 50 as illustrated in FIG. 17A, the relation "$\lambda_{IDT} > 1.138 \times \lambda_{cap}$" has only to be satisfied when the pitch of electrode fingers of a resonator having the largest pitch of electrode fingers of the series resonators that are included in one of the transmit filter 48 and the receive filter 50 having a pass band frequency higher than the other and are connected in parallel with the cancel circuit 40a is $\lambda_{IDT}$. Thus, the loss of the signal passing through the acoustic wave resonator connected to the acoustic wave delay line or the longitudinal coupling type acoustic wave resonator in series can be suppressed.

It is preferable that the power durability of the acoustic wave resonators 54 and 56 included in the cancel circuit 40a is higher. In order to improve the power durability, it is preferable that one of comb-like electrodes of the IDT is connected to the other of the IDT in series via an isolated electrical conductor. In particular, the electrical power of the transmit signal is large. It is therefore preferable that the comb-like electrodes of the IDT are connected in series via the isolated electrical conductor and the power durability of the acoustic wave resonator 54 provided on the side of the transmit terminal Tx is improved.

In the second embodiment, the transmit filter 48 and the receive filter 50 are a ladder type acoustic wave filter. However, at least one of the filters illustrated in FIG. 4 through FIG. 7 may be used. A surface acoustic wave resonator is used as the transmit filter 48 and the receive filter 50. However, a love wave resonator and a boundary acoustic wave filter may be used.

In the first embodiment and the second embodiment, the duplexers used in the North America PCS of which transmit band is 1850 MHz to 1910 MHz and of which receive band is 1930 MHz to 1990 MHz are described. However, other duplexers having other transmit bands and other receive bands may be used. For example, the duplexers may be used in a Cellular system of which transmit band is 824 MHz to 849 MHz and of which receive band is 869 MHz to 894 MHz.

Third Embodiment

Figure 28A:
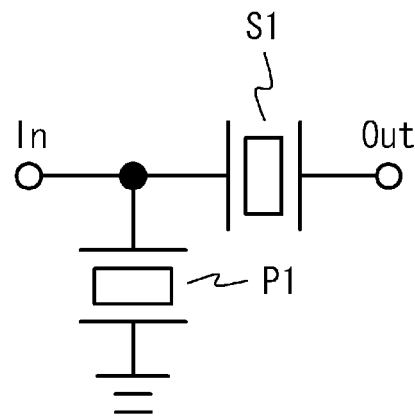
FIG. 28A illustrates an example of a circuit diagram of a single-stage ladder type acoustic wave filter.
Figure 28B:
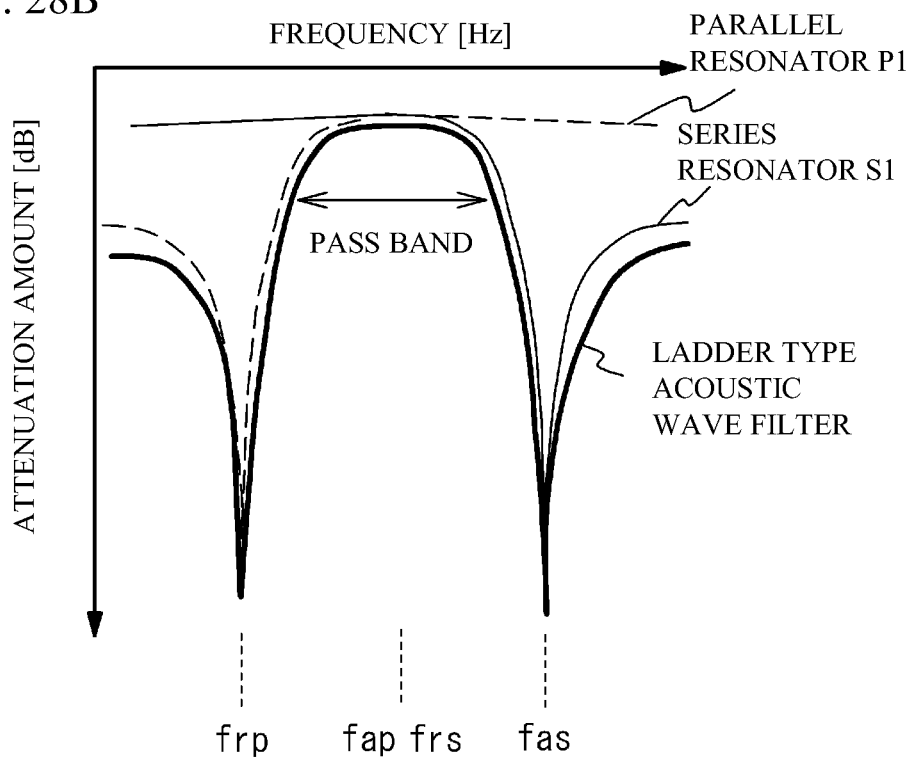
FIG. 28B illustrates an example of pass characteristic.

A third embodiment is an embodiment where isolation characteristic of a suppressed band higher than a pass band of a transmit filter is improved in a duplexer using a ladder type acoustic wave filter as the transmit filter. First, a description will be given of the pass characteristic of the ladder type acoustic wave filter. FIG. 28A illustrates an example of a circuit diagram of a single-stage ladder type acoustic wave filter. FIG. 28B illustrates an example of the pass characteristic. As illustrated in FIG. 28A, in the single-stage ladder type acoustic wave filter, a series resonator S1 is connected between an input terminal "In" and an output terminal "Out" in series, and a parallel resonator P1 is connected in parallel.

A description will be given of the pass characteristic of the single-stage ladder type acoustic wave filter with reference to FIG. 28B. In FIG. 28B, a thick solid line indicates the pass characteristic of the single-stage ladder type acoustic wave filter, a thin solid line indicates the pass characteristic of the series resonator S1, and a broken line indicates the pass characteristic of the parallel resonator P1. As illustrated in FIG. 28B, a pass amount of the series resonator S1 indicates a maximum at the resonance frequency $f_{rs}$ and indicates a minimum at the anti-resonance frequency $f_{as}$. On the other hand, a pass amount of the parallel resonator P1 indicates a minimum at the resonance frequency $f_{rp}$, and indicates a maximum at the anti-resonance frequency $f_{cap}$. Therefore, when the resonance frequency $f_{rs}$ of the series resonator S1 is approximately the same as the anti-resonance frequency $f_{cap}$ of the parallel resonator P1, a ladder type acoustic wave filter having band pass characteristic is provided. Thus, in the pass characteristic of the ladder type acoustic wave filter, the pass characteristic of the series resonator S1 has an influence on the high frequency side of the pass band, and the pass characteristic of the parallel resonator P1 has an influence on the low frequency side of the pass band.

However, in the single-stage ladder type acoustic wave filter, a suppressed band having a sufficient width does not occur in a frequency band higher than the pass band or in a frequency band lower than the pass band. For example, there is a method for using a plurality of series resonators of which anti-resonance frequency is different from each other as a method for widening the suppressed band of the frequency band higher than the pass band.

Figure 29A:
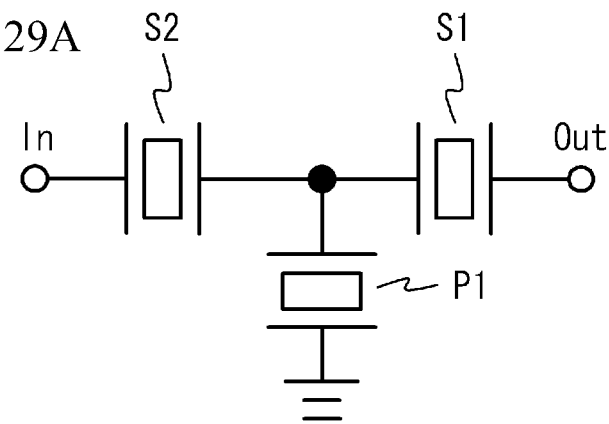
FIG. 29A illustrates an example of a circuit diagram of a ladder type acoustic wave filter having two series resonators.
Figure 29B:
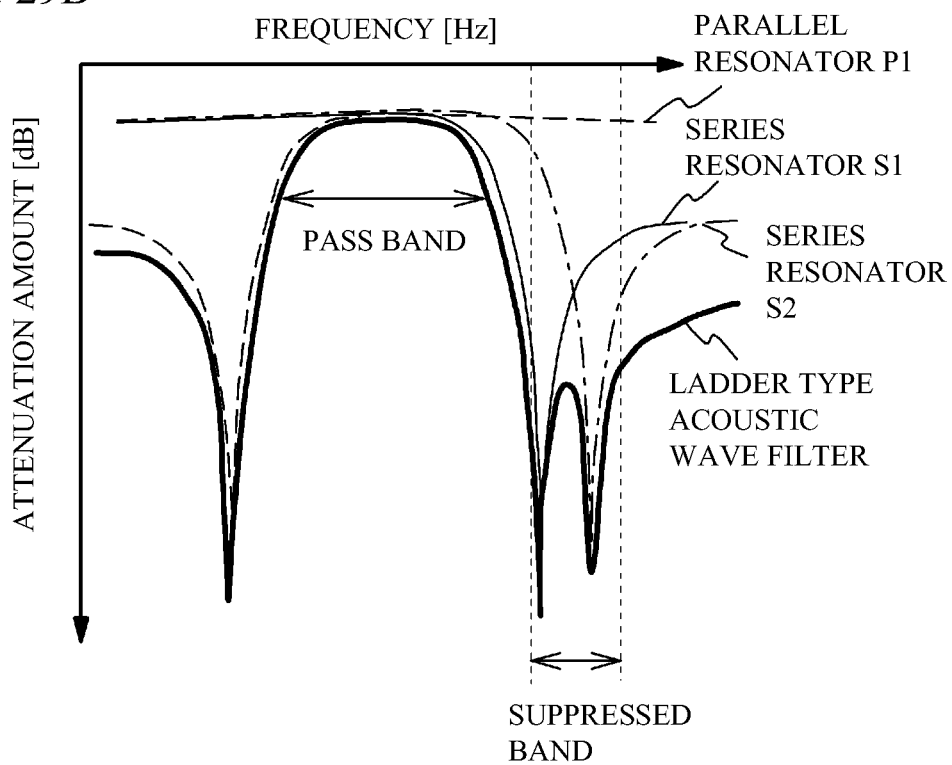
FIG. 29B illustrates an example of pass characteristic.

FIG. 29A illustrates an example of a circuit diagram of a ladder type acoustic wave filter having two series resonators. FIG. 29B illustrates an example of pass characteristic. As illustrated in FIG. 29A, a series resonator S2 of which anti-resonance frequency is higher than that of the series resonator S1 is connected between the input terminal "In" and the output terminal "Out" in series in addition to the series resonator S1. In FIG. 29B, a thick solid line indicates the pass characteristic of the ladder type acoustic wave filter having the two series resonators, and a dashed-dotted line indicates the pass characteristic of the series resonator S2. As illustrated in FIG. 29B, in the ladder type acoustic wave filter having the two series resonators, a suppressed band reflecting the anti-resonance characteristic of the two series resonators S1 and S2 occurs in a frequency band higher than the pass band.

Figure 30A:
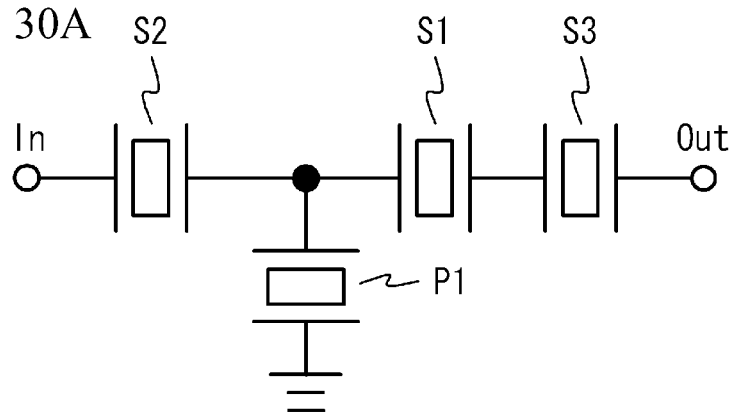
FIG. 30A illustrates an example of a circuit diagram of a ladder type acoustic wave filter having three series resonators.
Figure 30B:
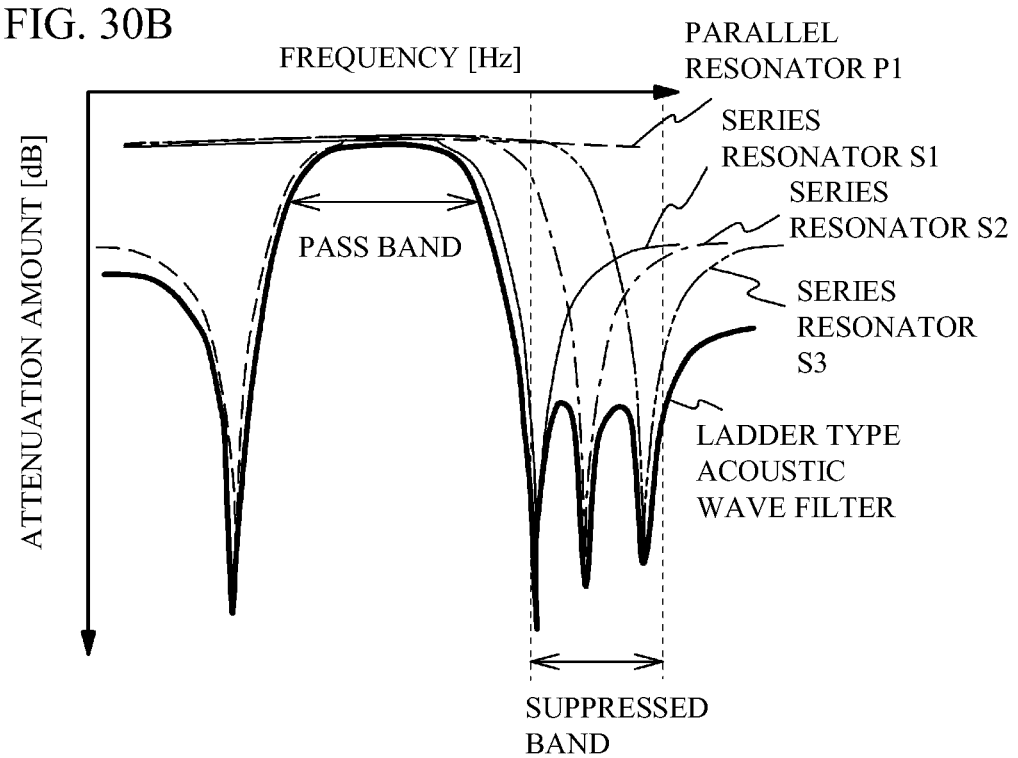
FIG. 30B illustrates an example of pass characteristic.

FIG. 30A illustrates an example of a circuit diagram of a ladder type acoustic wave filter having three series resonators. FIG. 30B illustrates an example of pass characteristic. As illustrated in FIG. 30A, a series resonator S3 of which anti-resonance frequency is higher than that of the series resonator S2 is further connected between the input terminal "In" and the output terminal "Out" in series. In FIG. 30B, a thick solid line indicates the pass characteristic of the ladder type acoustic wave filter having the three series resonators, and a dashed two-dotted line indicates the pass characteristic of the series resonator S3. As illustrated in FIG. 30B, in the ladder type acoustic wave filter having the three series resonators, a suppressed band reflecting the anti-resonance characteristic of the three series resonators S1 through S3 occurs in a frequency band higher than the pass band.

In the ladder type acoustic wave filter, a plurality of series resonators of which anti-resonance frequency is different from each other are provided, in order to generate a suppressed band having a sufficient width in a frequency band higher than the pass band. When the ladder type acoustic wave filter is used in a duplexer, the isolation characteristic on the side of high frequency is frequency characteristic reflecting the anti-resonance characteristic of the series resonators of the ladder type filter. That is, the isolation signal reflects the anti-resonance characteristic of the series resonator of the ladder type acoustic wave filter. And, an attenuation pole occurs in the suppressed band on the side of high frequency. Thus, the amplitude characteristic and the phase characteristic drastically change in the suppressed band. It is therefore preferable that the frequency characteristic of a signal having passed through the cancel circuit reflects the anti-resonance characteristic of the series resonator, in order to cancel the isolation signal with the signal having passed through the cancel circuit.

Figure 31A:
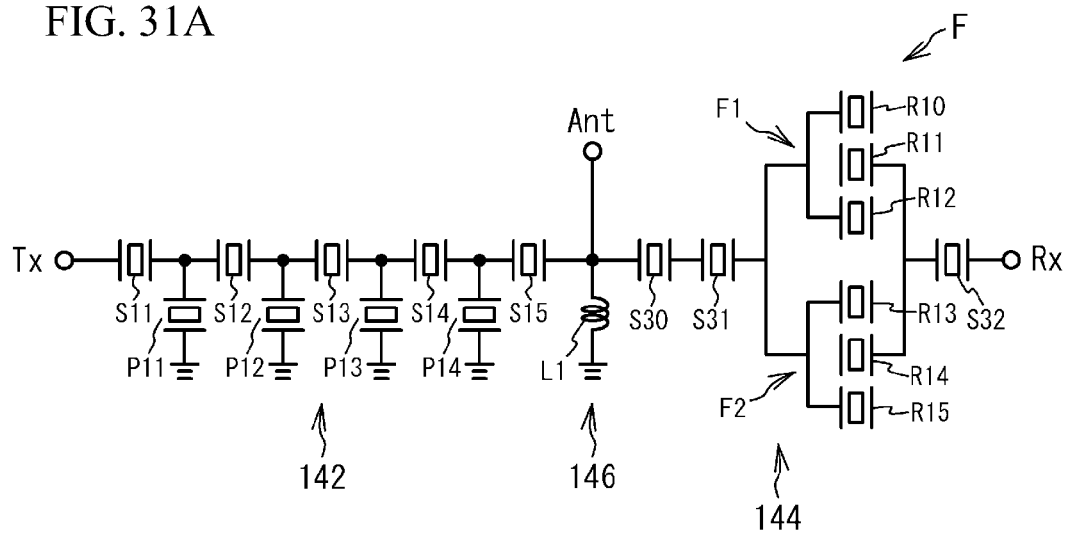
FIG. 31A illustrates an example of a circuit diagram of a duplexer in accordance with a third comparative example.
Figure 31B:
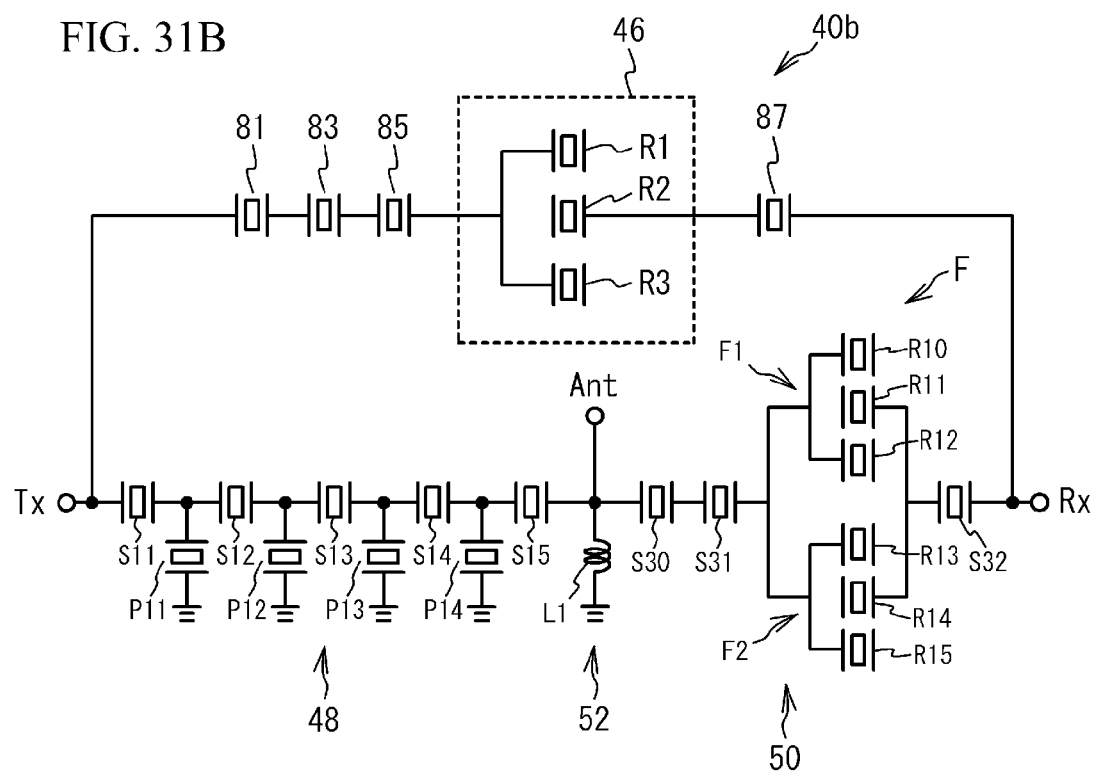
FIG. 31B illustrates an example of a circuit diagram of a duplexer in accordance with a third embodiment.

FIG. 31A illustrates an example of a circuit diagram of a duplexer in accordance with a third comparative example. FIG. 31B illustrates an example of a circuit diagram of a duplexer in accordance with the third embodiment. The duplexers cover a Band 1 of W-CDMA system (transmit band: 1920 MHz to 1980 MHz, receive band: 2110 MHz to 2170 MHz). As illustrated in FIG. 31A, the duplexer of the third comparative example has the transmit filter 142, the receive filter 144 and the matching circuit 146. The transmit filter 142 is an eight-stage ladder type acoustic wave filter and has the series resonators S11 through S15 and the parallel resonators P11 through P14. The receive filter 144 has acoustic wave resonators S30 through S32 and a longitudinal coupling type acoustic wave resonator filter F that are connected between the antenna terminal Ant and the receive terminal Rx in series. The longitudinal coupling type acoustic wave resonator filter F has two longitudinal coupling type acoustic wave resonator filters F1 and F2 connected to each other in parallel. The longitudinal coupling type acoustic wave resonator filter F1 has three acoustic wave resonators R10 through R12. The longitudinal coupling type acoustic wave resonator filter F2 has three acoustic wave resonators R13 through R15. The series resonators S11 through S15, the parallel resonator P11 through P14 and the acoustic wave resonators S30 through S32 and R10 through R15 are surface acoustic wave resonators. The matching circuit 146 has the inductor L1 connected between the antenna terminal Ant and the ground.

As illustrated in FIG. 31B, the duplexer of the third embodiment has the transmit filter 48, the receive filter 50, the matching circuit 52 and a cancel circuit 40b. The transmit filter 48, the receive filter 50 and the matching circuit 52 are the same as the third comparative example. Therefore, an explanation is omitted. The cancel circuit 40b is connected between the transmit terminal Tx and the receive terminal Rx in parallel with the transmit filter 48 and the receive filter 50. The cancel circuit 40b has acoustic wave resonators 81, 83, 85 and 87 and the longitudinal coupling type acoustic wave resonator 46 connected in series. The acoustic wave resonators 81 through 85 are connected to the transmit terminal Tx side of the longitudinal coupling type acoustic wave resonator 46. The acoustic wave resonator 87 is connected to the receive terminal Rx side of the longitudinal coupling type acoustic wave resonator 46. The longitudinal coupling type acoustic wave resonator 46 has the three acoustic wave resonators R1 through R3. The acoustic wave resonators 81 through 87 and R1 through R3 are surface acoustic wave resonators.

In the third comparative example and the third embodiment, a multi-stage ladder type acoustic wave filter is used as the transmit filter. Therefore, as described with reference to FIG. 28A through FIG. 30B, the isolation signal has an attenuation pole in the suppressed band (in the receive band) on the side of high frequency of the transmit filter. And, the amplitude characteristic and the phase characteristic of the isolation signal drastically change in the suppressed band. It is preferable that the parameters of the acoustic wave resonators R1 through R3 structuring the longitudinal coupling type acoustic wave resonator 46 are adequately set, and the frequency characteristic of a signal having passed through the cancel circuit 40b reflects the anti-resonance characteristic of the acoustic wave resonators 81 through 87, in order to cancel the isolation signal with the signal having passed through the cancel circuit 40b.

Figure 32A:
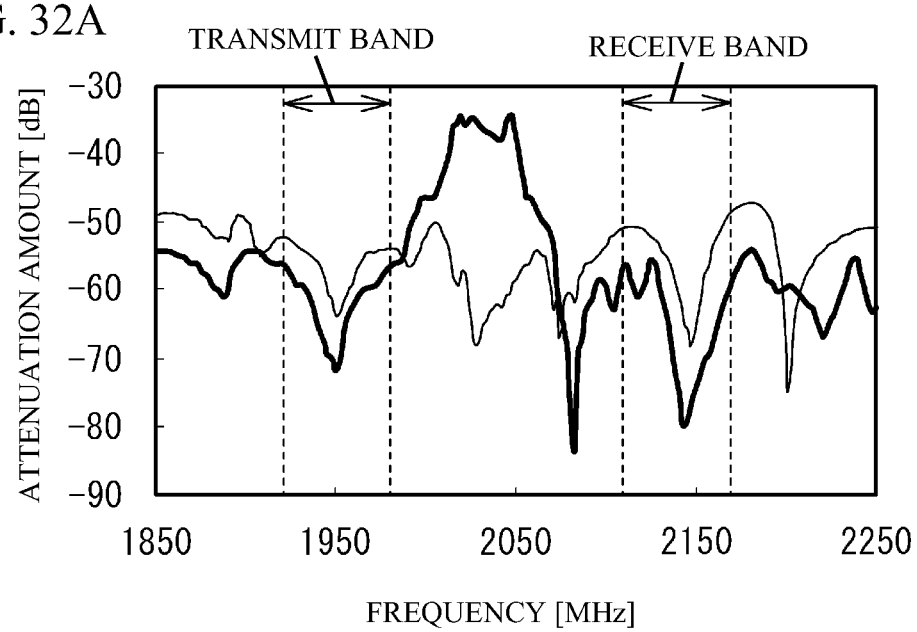
FIG. 32A illustrates a simulation result of amplitude characteristic of a signal having passed through a cancel circuit.
Figure 32B:
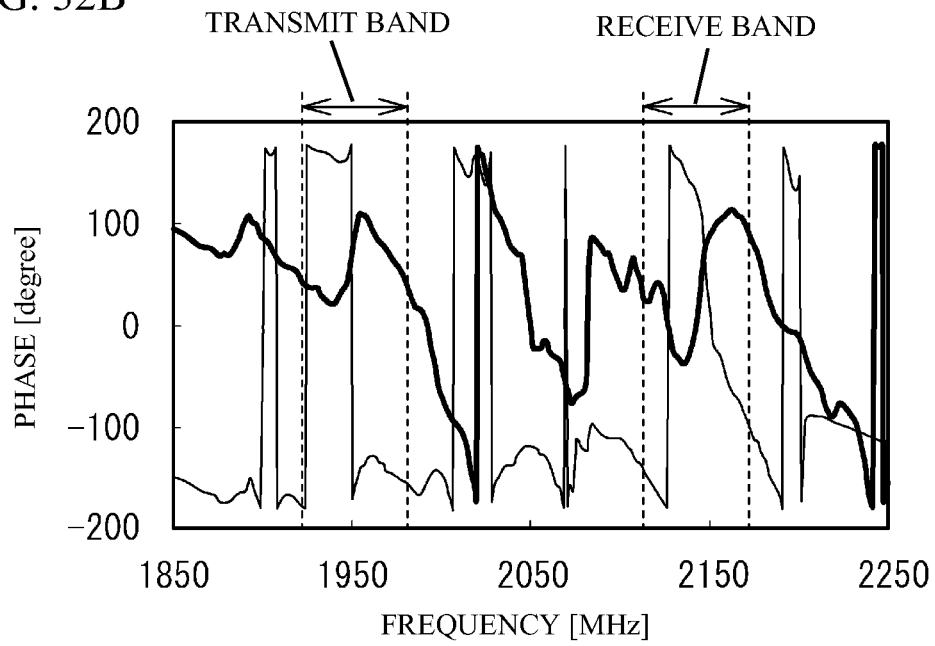
FIG. 32B illustrates a simulation result of phase characteristic.

FIG. 32A illustrates a simulation result of the amplitude characteristic of the signal having passed through the cancel circuit 40b. FIG. 32B illustrates a simulation result of the phase characteristic. In FIG. 32A and FIG. 32B, a thick line indicates the signal having passed through the cancel circuit 40b. For comparison, a thin line indicates the isolation signal of the duplexer of the third comparative example. As illustrated in FIG. 32A and FIG. 32B, when the parameters of the longitudinal coupling type acoustic wave resonator 46 and the anti-resonance frequency of the acoustic wave resonators 81 through 87 are adequately set, the signal having passed through the cancel circuit 40b has approximately the same amplitude as the isolation signal and has approximately opposite phase with respect to the isolation signal in the transmit band and the receive band. In particular, the isolation signal has an attenuation pole in the receive band. However, the signal having passed through the cancel circuit 40b has an attenuation pole in the receive band, and secures the same amplitude characteristic.

Figure 33:
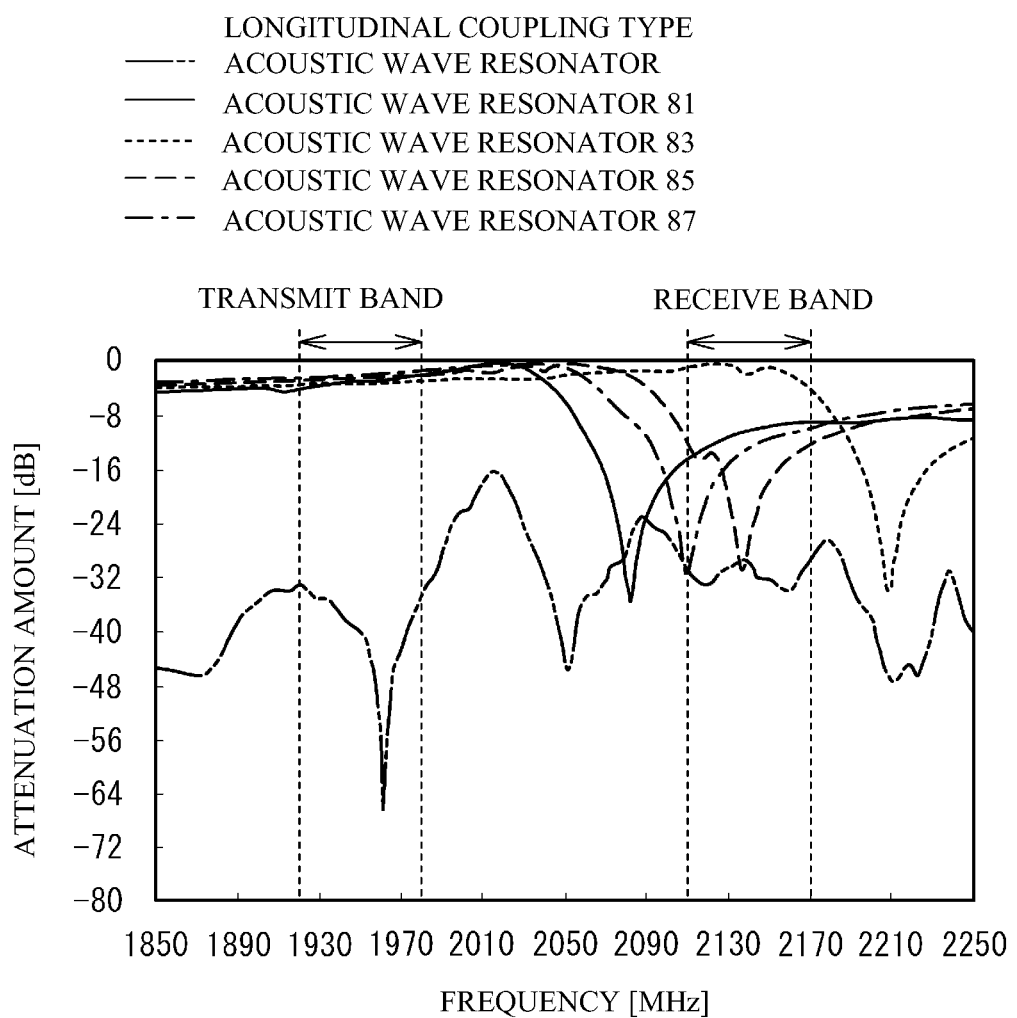
FIG. 33 illustrates a simulation result of frequency characteristic of a longitudinal coupling type acoustic wave resonator and an acoustic wave resonator structuring a cancel circuit.

FIG. 33 illustrates a simulation result of the frequency characteristic of the longitudinal coupling type acoustic wave resonator 46 and the acoustic wave resonators 81 through 87 structuring the cancel circuit 40b. In FIG. 33, a dashed two-dotted line indicates the frequency characteristic of the longitudinal coupling type acoustic wave resonator 46. A solid line, a dotted line, a broken line and a dashed-dotted line indicate the frequency characteristics of the acoustic wave resonators 81 through 87. As illustrated in FIG. 33, the anti-resonance frequencies of the acoustic wave resonators 81 through 87 are different from each other. The anti-resonance frequency of the acoustic wave resonator 85 that is one of the acoustic wave resonators 81 through 87 is set in the receive band. Based on the simulation result of the FIG. 32A and FIG. 33, it is found that the signal having passed through the cancel circuit 40b has the same attenuation pole as that of the isolation signal in the receive band, and the signal having passed through the cancel circuit 40b has the same amplitude characteristic as the isolation signal when the anti-resonance characteristic of the acoustic wave resonator 85 is used.

Figure 34:
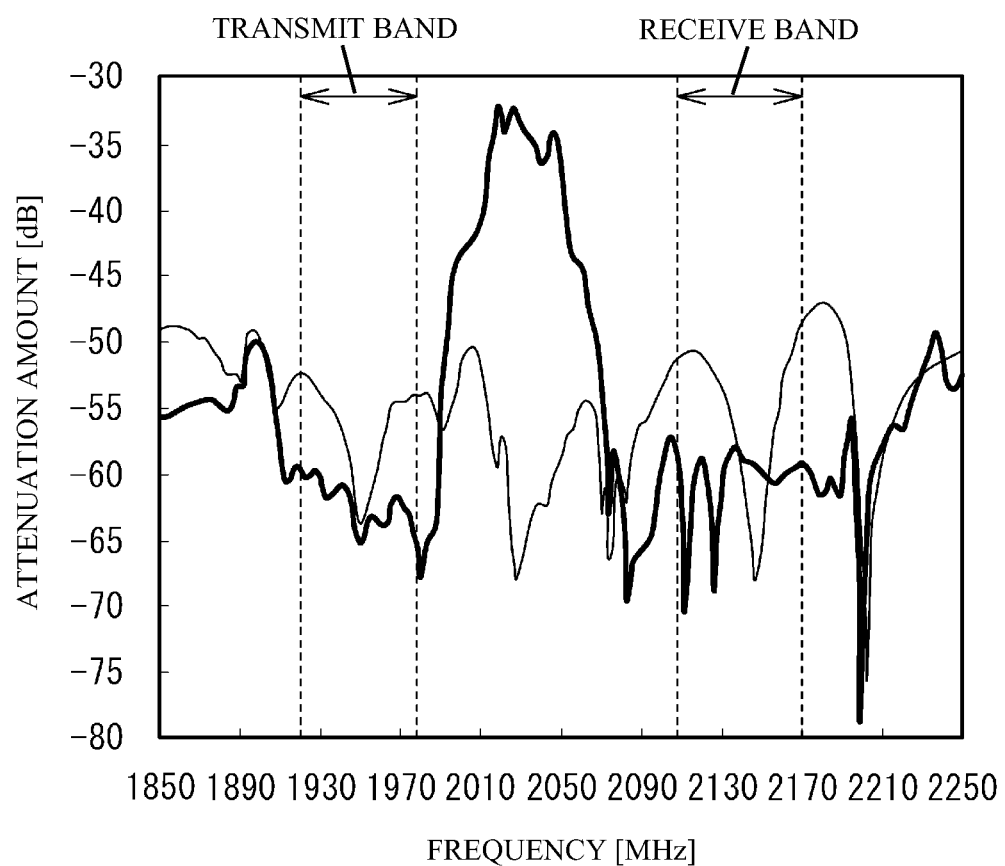
FIG. 34 illustrates a simulation result of amplitude characteristic of an isolation signal of duplexers of the third comparative example and the third embodiment.

FIG. 34 illustrates a simulation result of the amplitude characteristic of the isolation signal of the duplexers of the third comparative example and the third embodiment. In FIG. 34, a thick line indicates the simulation result of the third embodiment, and a thin line indicates the simulation result of the third comparative example. As illustrated in FIG. 34, the isolation characteristic of the third embodiment is improved in both of the transmit band and the receive band, compared to the third comparative example. In particular, the isolation signal of the third comparative example has an attenuation pole in the receive band and the amplitude characteristic of the isolation signal of the third comparative example drastically changes. In the third embodiment, the isolation characteristic is improved in the whole of the receive band. This is because the signal having passed through the cancel circuit 40b has the same attenuation pole as that of the isolation signal in the receive band, and secures the same amplitude characteristic as the isolation signal in the receive band, as mentioned above, when the anti-resonance characteristic of the acoustic wave resonator 85 is used.

As mentioned above, in accordance with the third embodiment, the cancel circuit 40b has the longitudinal coupling type acoustic wave resonator 46 and the acoustic wave resonators 81 through 87 connected to the longitudinal coupling type acoustic wave resonator 46 in series. The transmit filter 48 is the ladder type acoustic wave filter. Therefore, the amplitude characteristic and the phase characteristic of the isolation signal drastically change in the suppressed band (the receive band) on the side of high frequency of the transmit filter 48. And so, the parameters of the longitudinal coupling type acoustic wave resonator 46 are adequately set, and the anti-resonance frequency of the acoustic wave resonator 85 is set in the receive band. Thus, as described with reference to FIG. 32A through FIG. 33, the signal having passed through the cancel circuit 40b has approximately the same amplitude as the isolation signal and the phase of the signal having passed through the cancel circuit 40b gets closer to approximately opposite phase with respect to the isolation signal in the transmit band and the receive band. Therefore, as illustrated in FIG. 34, the isolation characteristic of the duplexer is more improved.

In the third embodiment, the duplexer has the transmit band lower than the receive band. However, the duplexer may have the receive band lower than the transmit band. In this case, the receive filter is structured by the ladder type acoustic wave filter, and the anti-resonance frequency of the acoustic wave resonator that is included in the cancel circuit and is connected to the longitudinal coupling type acoustic wave resonator in series is set in the transmit band. Thus, the isolation characteristic in the transmit band can be more improved. It is therefore preferable that one of the transmit filter and the receive filter having a pass band frequency lower than the other is a ladder type acoustic wave filter, the anti-resonance frequency of the acoustic wave resonator that is included in the cancel circuit and is connected to the longitudinal coupling type acoustic wave resonator in series is in the pass band of one of the transmit filter and the receive filter having a pass band frequency higher than the other.

In the third embodiment, when the cancel circuit 40b is connected between the transmit terminal Tx and the antenna terminal Ant as in the case of FIG. 18A and FIG. 18B, not only the isolation characteristic of the duplexer but also the attenuation characteristic of the transmit filter 48 can be improved. That is, when the cancel circuit is connected in parallel with at least one of the acoustic wave resonators structuring the ladder type acoustic wave filter, and the anti-resonance frequency of the acoustic wave resonator connected to the longitudinal coupling type acoustic wave resonator in series is in the suppressed band of the side of high frequency of the ladder type acoustic wave filter, the attenuation characteristic of the filter can be improved.

In the third embodiment, the acoustic wave resonators 81 through 87 are connected to the longitudinal coupling type acoustic wave resonator 46 in series, and the anti-resonance frequency of the acoustic wave resonator 85 is set in the receive band. However, two or more acoustic wave resonators of the acoustic wave resonators connected to the longitudinal coupling type acoustic wave resonator 46 in series may have anti-resonance frequency in the receive band. One of the acoustic wave resonators may be connected to the longitudinal coupling type acoustic wave resonator 46 in series, and the anti-resonance frequency of the acoustic wave resonator may be set in the receive band. However, it is preferable that two or more acoustic wave resonators are connected to the longitudinal coupling type acoustic wave resonator 46 in series, because freedom degree of designing is increased in the case. The acoustic wave resonator, of which anti-resonance frequency is set in the receive band, connected to the longitudinal coupling type acoustic wave resonator 46 in series may be connected to one of the input side and the output side, or both of the input side and the output side of the longitudinal coupling type acoustic wave resonator 46.

As described with reference to FIG. 28A and FIG. 28B, the single-stage ladder type acoustic wave filter does not have a suppressed band of a sufficient width not only on the higher frequency side but also on the lower frequency side. There is a method for using a plurality of parallel resonators of which resonance frequency is different from each other as a method for widening the suppressed band of the frequency band lower than the pass band. When the ladder type acoustic wave filter is used in a duplexer, the isolation characteristic reflects the resonance characteristic of the parallel resonators of the ladder type filter. That is, the isolation signal reflects the resonance characteristic of the parallel resonator of the ladder type acoustic wave filter. And, an attenuation pole occurs in the suppressed band on the side of low frequency. Thus, the amplitude characteristic and the phase characteristic drastically change in the suppressed band. It is therefore preferable that the frequency characteristic of a signal having passed through the cancel circuit reflects the resonance characteristic of the parallel resonator, in order to cancel the isolation signal with the signal having passed through the cancel circuit.

The technical idea of the third embodiment is applied to the case. One of the transmit filter and the receive filter having a pass band frequency higher than the other is a ladder type acoustic wave filter. The resonance frequency of the acoustic wave resonator that is included in the cancel circuit and is connected to the longitudinal coupling type acoustic wave resonator in parallel is in the pass band of one of the transmit filter and the receive filter having a pass band frequency lower than the other. In this case, the isolation characteristic of the duplexer can be more improved.

Figure 35:
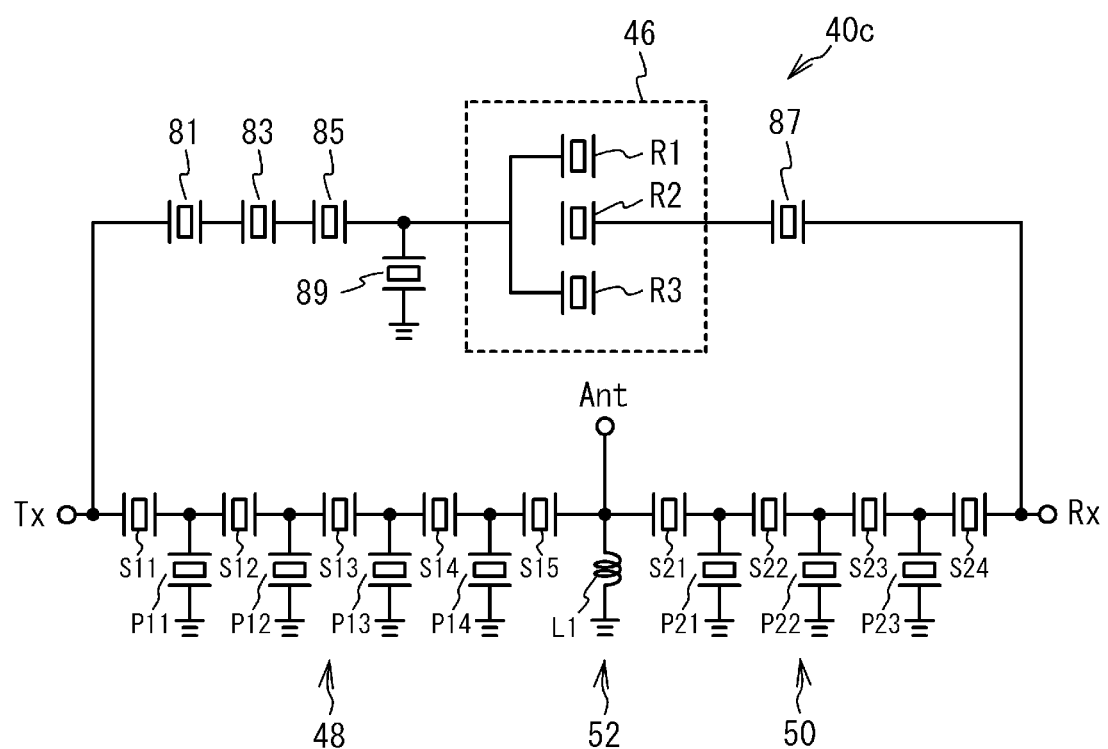
FIG. 35 illustrates an example of a circuit diagram of a duplexer in accordance with a modified embodiment of the third embodiment.

FIG. 35 illustrates an example of a circuit diagram of a duplexer in accordance with a modified embodiment of the third embodiment. The duplexer covers a Band 1 of W-CDMA system (transmit band: 1920 MHz to 1980 MHz, receive band: 2110 MHz to 2170 MHz), as well as the third embodiment. As illustrated in FIG. 35, the transmit filter 48 is an eight-stage ladder type acoustic wave filter and has the series resonators S11 through S15 and the parallel resonators P11 through P14 as well as the third embodiment. The receive filter 50 is a six-stage ladder type acoustic wave filter and has the series resonators S21 through S24 and the parallel resonators P21 through P23. The matching circuit 52 has the inductor L1 connected between the antenna terminal Ant and the ground.

A cancel circuit 40c connected between the transmit terminal Tx and the receive terminal Rx in parallel with the transmit filter 48 and the receive filter 50 has an acoustic wave resonator 89 connected in parallel with the longitudinal coupling type acoustic wave resonator 46, in addition to the structure of the cancel circuit 40b of the third embodiment. The resonance frequency of the acoustic wave resonator 89 is set in the transmit band.

In accordance with the modified embodiment of the third embodiment, the cancel circuit 40c has the acoustic wave resonator 89 connected in parallel with the longitudinal coupling type acoustic wave resonator 46 in addition to the longitudinal coupling type acoustic wave resonator 46 and the acoustic wave resonators 81 through 87 connected to the longitudinal coupling type acoustic wave resonator 46 in series. The transmit filter 48 and the receive filter 50 are ladder type acoustic wave filters. Therefore, the amplitude characteristic and the phase characteristic of the isolation signal drastically change in the suppressed band (the receive band) on the higher frequency side of the transmit filter 48 and the suppressed band (the transmit band) on the lower frequency side of the receive filter 50. Thus, the parameters of the longitudinal coupling type acoustic wave resonator 46 as described in the third embodiment are adequately set, and the anti-resonance frequency of the acoustic wave resonator 85 is set in the receive band. Further, the resonance frequency of the acoustic wave resonator 89 is set in the transmit band. Thus, the signal having passed through the cancel circuit 40c has approximately the same amplitude as the isolation signal and the phase of the signal having passed through the cancel circuit 40c gets closer to approximately opposite phase with respect to the isolation signal in the transmit band and the receive band. Therefore, the isolation characteristic of the duplexer can be more improved.

In the modified embodiment of the third embodiment, the duplexer may have the receive band lower than the transmit band. In this case, the transmit filter is structured by the ladder type acoustic wave filter, and the resonance frequency of the acoustic wave resonator that is included in the cancel circuit and is connected to the longitudinal coupling type acoustic wave resonator in parallel is set in the receive band. Thus, the isolation characteristic in the receive band can be more improved.

In the modified embodiment of the third embodiment, when the cancel circuit 40c is connected between the receive terminal Rx and the antenna terminal Ant, not only the isolation characteristic of the duplexer but also the attenuation characteristic of the receive filter 50 can be improved. That is, when the cancel circuit is connected in parallel with at least one of the acoustic wave resonators structuring the ladder type acoustic wave resonator, and the resonance frequency of the acoustic wave resonator connected in parallel with the longitudinal coupling type acoustic wave resonator is in the suppressed band on the side of low frequency of the ladder type acoustic wave filter, the attenuation characteristic of the filter can be improved.

In the modified embodiment of the third embodiment, a plurality of acoustic wave resonators may be connected in parallel with the longitudinal coupling type acoustic wave resonator 46, and a resonance frequency of at least one of the plurality of acoustic wave resonators may be set in the transmit band. The acoustic wave resonator, of which resonance frequency is set in the transmit band, connected in parallel with the longitudinal coupling type acoustic wave resonator 46 may be connected to one of the input side and the output side, or both of the input side and the output side of the longitudinal coupling type acoustic wave resonator 46.

In the third embodiment and the modified embodiment of the third embodiment, an electrostatic capacitor or an acoustic wave resonator may be connected in series with the longitudinal coupling type acoustic wave resonator 46 in order to suppress the signal amount flowing into the cancel circuit, as well as the first embodiment. The longitudinal coupling type acoustic wave resonator 46 may be an acoustic wave delay line. Further, the cancel circuits 40b and 40c may be connected as in the case of FIG. 17A through FIG. 17D of the first embodiment. Further, the resonator in the filter may be the love wave resonator, the boundary acoustic wave resonator or the piezoelectric thin film resonator as described with reference to FIG. 8C through FIG. 9B, other than the surface acoustic wave resonator.

In the third embodiment and the modified embodiment of the third embodiment, the duplexers cover the Band 1 of the W-CDMA system of which transmit band is 1920 MHz to 1980 MHz and of which receive band is 2110 MHz to 2170 MHz are described. However, other duplexers having other transmit bands and other receive bands may be used. For example, the duplexers may be used in the North America PCS or the Cellular system as in the case of the first embodiment and the second embodiment.

When the signal having passed through the cancel circuit cancels the isolation signal, and the amplitude characteristic and the phase characteristic of the isolation signal drastically change in the transmit band and/or the receive band in the cases of the first embodiment through the third embodiment, it is preferable that the cancel circuit has a longitudinal coupling type acoustic wave resonator or a delay line.

Fourth Embodiment

Figure 36:
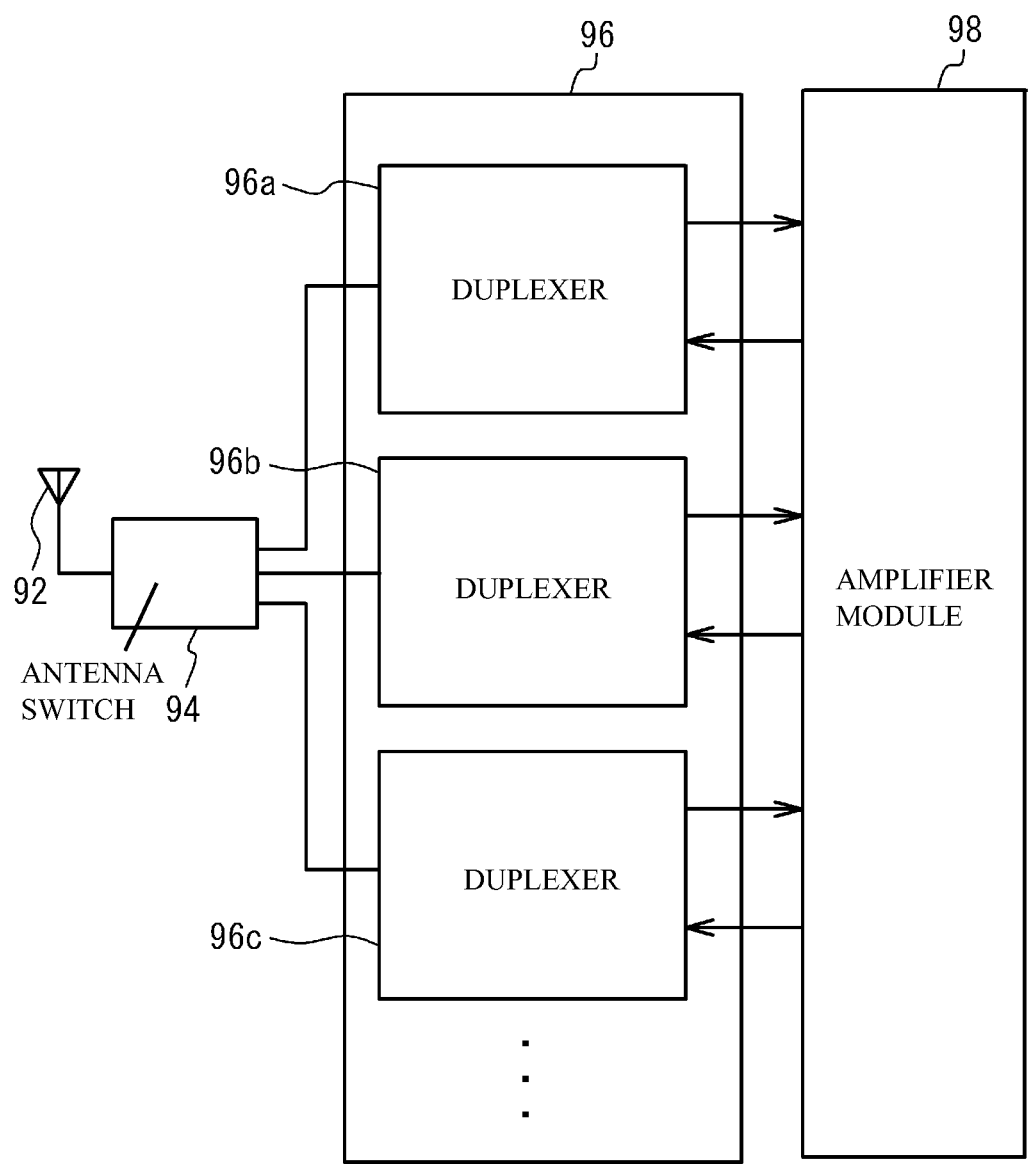
FIG. 36 illustrates a block diagram of a communication module in accordance with a fourth embodiment.

A fourth embodiment is an example of a communication module having any of the duplexers of the first embodiment through the third embodiment. FIG. 36 illustrates a block diagram of a communication module in accordance with the fourth embodiment. As illustrated in FIG. 36, the communication module has an antenna 92, an antenna switch 94, a duplexer bank 96 and an amplifier module 98. The communication module is an RF module for a mobile phone and covers a plurality of communication systems such as a GSM (registered trademark) (Global System for Mobile Communication) system or the W-CDMA system. With respect to the GSM system, the communication module covers 850 MHz band (GSM 850), 900 MHz band (GSM 900), 1800 MHz band (GSM 1800), and 1900 MHz band (GSM 1900). The antenna 92 is capable of transmitting and receiving a transmit signal and a receive signal of the GSM system and the W-CDMA system.

The duplexer bank 96 includes a plurality of duplexers 96a through 96c. Each of the duplexers 96a through 96c covers a plurality of communication systems. The antenna switch 94 selects a duplexer covering a communication system from the plurality of duplexers included in the duplexer bank 96 according to the communication system for transmitting and receiving a signal, and connects the selected duplexer and the antenna 92. Each duplexer is connected to the amplifier module 98. The amplifier module 98 amplifies a signal received by the receive filter of the duplexers 96a through 96c and outputs the amplified signal to a processing unit. The amplifier module 98 amplifies a signal generated by the processing unit and outputs the amplified signal to the transmit filter of the duplexers 96a through 96c.

At least one of the duplexers 96a through 96c is a duplexer of the first embodiment through the third embodiment. It is therefore possible provide a communication module in which the isolation characteristic of the duplexer is improved without increasing of the insertion loss. The communication module may be mounted on an electronic device such as a wireless LAN (Local Area Network), a personal computer, or a PDA (Personal Digital Assistant).

In the fourth embodiment, the communication module of the first embodiment through the third embodiment is described. However, a communication module having a filter including a cancel circuit connected in parallel with at least one of acoustic wave resonators. In this case, it is possible to provide a communication module in which attenuation characteristic of a filter is improved, without increasing of the insertion loss.

The present invention is not limited to the specifically described embodiments, but other embodiments and variations may be made without departing from the scope of the claimed invention.

What is claimed is:

1. A duplexer comprising:
   a transmit filter that is connected between an antenna terminal and a first terminal and that includes a first group of acoustic wave resonators that are located in a first path connected between the antenna terminal and the first terminal;
   a receive filter that is connected between the antenna terminal and a second terminal and that includes a second group of acoustic wave resonators that are located in a second path connected between the antenna terminal and the second terminal and;
   a cancel circuit, the cancel circuit including:
   a third path having a first node and a second node, each of which is located in the first path or the second path so that the third path is parallelly connected to at least a part of the first and second group of acoustic wave resonators;
   a pair of first capacitors that are located in the third path and that are connected in series between the first and second nodes and;
   a first acoustic wave resonator that is located in the third path and that is connected between the pair of first capacitors.

2. The duplexer as claimed in claim 1, wherein the cancel circuit further includes a second acoustic wave resonator or a second capacitor having two ends, one end being connected to a third node between the first and second nodes in the third path and another end being connected to ground.

3. The duplexer as claimed in claim 2, wherein the second acoustic wave resonator is structured by an IDT (Inter Digital Transducer).

4. The duplexer as claimed in claim 2, wherein the second capacitor is structured by an IDT (Inter Digital Transducer) without a reflector.

5. The duplexer as claimed in claim 1, wherein the first acoustic wave resonator is structured by an IDT without a reflector.

6. The duplexer as claimed in claim 5, wherein the first acoustic wave resonator is an acoustic wave delay line.

7. The duplexer as claimed in claim 1, wherein the first acoustic wave resonator is a pair of IDTs (Inter Digital Transducer) that are arranged adjacent to each other.

8. The duplexer as claimed in claim 7, wherein first acoustic wave resonator is an acoustic wave delay line.

9. The duplexer as claimed in claim 1, wherein each capacitor of the pair of first capacitors is structured by an IDT (Inter Digital Transducer) without a reflector.

10. The duplexer as claimed in claim 1, wherein the first acoustic wave resonator is structured by an IDT (Inter Digital Transducer).

11. The duplexer as claimed in claim 1, wherein the cancel circuit is connected between the first terminal and the second terminal in parallel with the transmit filter and the receive filter.

12. A duplexer comprising:
   a transmit filter that is connected between an antenna terminal and a first terminal and that includes a first group of acoustic wave resonators that are located in a first path connected between the antenna terminal and the first terminal;
   a receive filter that is connected between the antenna terminal and a second terminal and that includes a second group of acoustic wave resonators that are located in a second path connected between the antenna terminal and the second terminal and;
a cancel circuit, the cancel circuit including:
   a third path having a first node and a second node, each of which is located in the first path or the second path so that the third path is parallelly connected to at least a part of the first and second group of acoustic wave resonators;
   a first capacitor that is located in the third path and that is connected in series between the first and second nodes;
   a first acoustic wave resonator that is located in the third path and that is connected to the first capacitor in series; and
a second acoustic wave resonator having two end, one end being connected to a third node between the first and second nodes in the third path and another end being connected to ground.

13. The duplexer as claimed in claim 12, wherein the first capacitor is structured by an IDT (Inter Digital Transducer) without a reflector.

14. The duplexer as claimed in claim 12, wherein the second acoustic wave resonator is structured by an IDT (Inter Digital Transducer).

15. The duplexer as claimed in claim 12, wherein the first acoustic wave resonator is structured by an IDT (Inter Digital Transducer).

16. The duplexer as claimed in claim 12, wherein the first acoustic wave resonator is structured by an IDT (Inter Digital Transducer) without a reflector.

17. The duplexer as claimed in claim 12, wherein the cancel circuit is connected between the first terminal and the second terminal in parallel with the transmit filter and the receive filter.

18. The duplexer as claimed in claim 12, wherein the first acoustic wave resonator is a pair of IDTs (Inter Digital Transducer) that are arranged adjacent to each other.

19. A duplexer comprising:
a transmit filter that is connected between an antenna terminal and a first terminal and that includes a first group of acoustic wave resonators that are located in a first path connected between the antenna terminal and the first terminal;
a receive filter that is connected between the antenna terminal and a second terminal and that includes a second group of acoustic wave resonators that are located in a second path connected between the antenna terminal and the second terminal and;
a cancel circuit, the cancel circuit including:
   a third path having a first node and a second node, each of which is located in the first path or the second path so that the third path is parallelly connected to at least a part of the first and second group of acoustic wave resonators;
   a pair of first capacitors that are located in the third path and that are connected in series between the first and second nodes and;
   a first acoustic wave resonator or an acoustic wave delay line that is located in the third path and that is connected between the pair of first capacitors.

* * * * *